US00RE46903E

(19) United States
(12) Reissued Patent
Takachi

(10) Patent Number: US RE46,903 E
(45) **Date of Reissued Patent: *Jun. 19, 2018**

(54) IMAGING DEVICE

(71) Applicant: SONY CORPORATION, Tokyo (JP)

(72) Inventor: Taizo Takachi, Kanagawa (JP)

(73) Assignee: SONY CORPORATION, Tokyo (JP)

( * ) Notice: This patent is subject to a terminal disclaimer.

(21) Appl. No.: 14/750,418

(22) Filed: Jun. 25, 2015

Related U.S. Patent Documents

Reissue of:
(64) Patent No.: 8,872,293
Issued: Oct. 28, 2014
Appl. No.: 13/352,820
Filed: Jan. 18, 2012

U.S. Applications:
(63) Continuation of application No. 14/749,380, filed on Jun. 24, 2015, which is an application for the reissue of Pat. No. 8,872,293.

(30) Foreign Application Priority Data

Feb. 15, 2011 (JP) ..... 2011-029963
Feb. 15, 2011 (JP) ..... 2011-029966

(51) Int. Cl.
*H01L 21/00* (2006.01)
*G02B 5/28* (2006.01)
(Continued)

(52) U.S. Cl.
CPC ..... *H01L 27/14627* (2013.01); *H01L 33/58* (2013.01); *H01L 21/78* (2013.01)

(58) Field of Classification Search
CPC ..... H01L 27/14625; H01L 27/14621; H01L 27/14685; H01L 27/14609; G02B 5/285; G02B 5/282
(Continued)

(56) References Cited

U.S. PATENT DOCUMENTS 4,388,128 A * 6/1983 Ogawa ..... G03F 7/0007 156/263
5,648,653 A * 7/1997 Sakamoto ..... H01L 27/14618 250/208.1
(Continued)

FOREIGN PATENT DOCUMENTS

JP 2001-203913 7/2001
JP 2002-261260 A 9/2002
(Continued)

OTHER PUBLICATIONS

Japanese Office Action dated May 26, 2015 in Patent Application No. 2011-029963 (without English Translation).

*Primary Examiner* — Tuan H Nguyen
(74) *Attorney, Agent, or Firm* — Oblon, McClelland, Maier & Neustadt, L.L.P.

(57) ABSTRACT

A solid-state imaging device includes: an optical filter in which a filter layer is formed on a transparent substrate; a solid-state imaging component that is arranged to be opposed to the optical filter and in which plural pixels that receive light made incident via the filter layer are arrayed in a pixel area of a semiconductor substrate; and a bonding layer that is provided between the optical filter and the solid-state imaging component and sticks the optical filter and the solid-state imaging component together.

22 Claims, 21 Drawing Sheets

(51) Int. Cl.
*H01L 27/146* (2006.01)
*H01L 33/58* (2010.01)
*H01L 21/78* (2006.01)

(58) Field of Classification Search
USPC ..... 257/432; 438/65
See application file for complete search history.

(56) References Cited

U.S. PATENT DOCUMENTS

| | | | | |
|---|---|---|---|---|
| 6,040,591 | A * | 3/2000 | Otsuka | H01L 27/1462 257/232 |
| 6,759,642 | B2 | 7/2004 | Hoshino | |
| 7,759,751 | B2 * | 7/2010 | Ono | H01L 27/14618 257/432 |
| 7,767,485 | B2 * | 8/2010 | Ogawa | H01L 27/14618 257/E21.536 |
| 7,851,880 | B2 * | 12/2010 | Suzuki | H01L 23/481 257/433 |
| 8,252,628 | B2 * | 8/2012 | Nabe | H01L 27/14618 257/686 |
| 8,541,820 | B2 * | 9/2013 | Hayasaki | H01L 21/76898 257/184 |
| 8,947,566 | B2 * | 2/2015 | Kobayashi | H01L 27/14632 257/292 |
| 2011/0147782 | A1 * | 6/2011 | Sano | H01L 27/14618 257/98 |
| 2013/0038764 | A1 * | 2/2013 | Takachi | 348/294 |

FOREIGN PATENT DOCUMENTS

| | | | |
|---|---|---|---|
| JP | 2003-204053 | A | 7/2003 |
| JP | 2005-109092 | A | 4/2005 |
| JP | 2008-186875 | A | 8/2008 |

* cited by examiner

<FIRST EMBODIMENT>

<FIRST EMBODIMENT>

<FIRST EMBODIMENT>

<FIRST EMBODIMENT>

<FIRST EMBODIMENT>

<FIRST EMBODIMENT>

<FIRST EMBODIMENT>

<FIRST EMBODIMENT>

<FIRST EMBODIMENT>
t1
t2
t3
t4
t5
t
FIG.9A SELECTION SIGNAL
FIG.9B RESET SIGNAL
FIG.9C TRANSFER SIGNAL

<FIRST EMBODIMENT>

<FIRST EMBODIMENT>

<SECOND EMBODIMENT>

<THIRD EMBODIMENT>

<FOURTH EMBODIMENT>

<FOURTH EMBODIMENT>
FIG.18
(a-1)
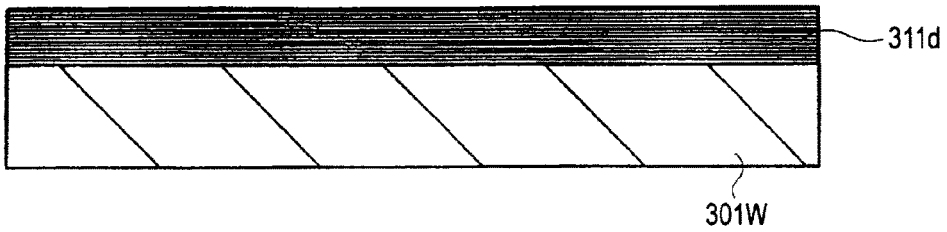
(a-2)
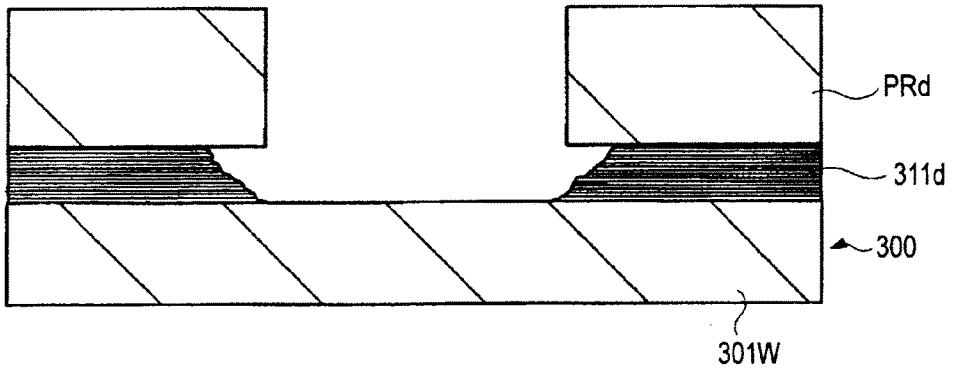
(a-3)
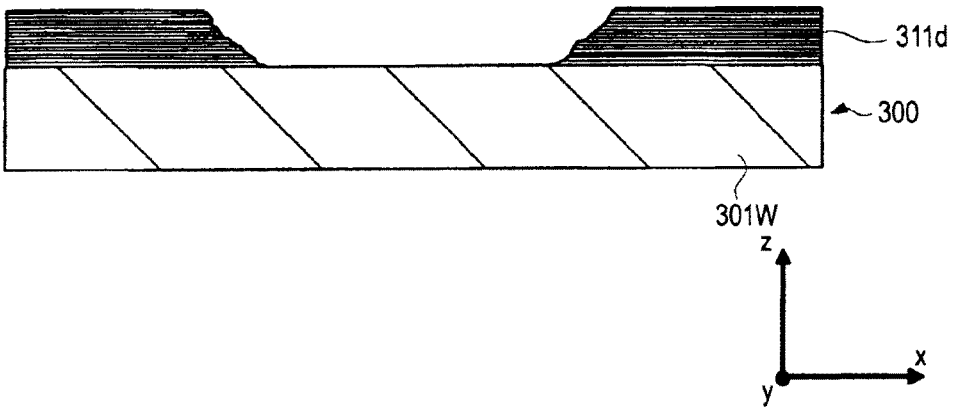

<FIFTH EMBODIMENT>

<FIFTH EMBODIMENT>

<FIFTH EMBODIMENT>

IMAGING DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 8,872,293. The reissue applications are application Ser. No. 14/749,380; and application Ser. No. 14/750,418 (i.e., this present application, which is a continuation reissue of application Ser. No. 14/749,380).*

FIELD

[The present disclosure relates to a solid-state imaging device and a method of manufacturing the solid-state imaging device. Further, the present disclosure relates to an electronic apparatus such as a camera including the solid-state imaging device.] *The present application is a continuation of Reissue U.S. application Ser. No. 14/749,380, filed Jun. 24, 2015, which is a Reissue of U.S. Pat. No. 8,872,293, and in turn contains subject matter related to Japanese Patent Application 2011-029963 filed in the Japanese Patent Office on Feb. 15, 2011, and Japanese Patent Application 2011-029966 filed in the Japanese Patent Office on Feb. 15, 2011, the entire contents of which are incorporated herein by reference.*

BACKGROUND

An electronic apparatus such as a digital video camera or a digital still camera includes a solid-state imaging device. For example, the electronic apparatus includes, as the solid-state imaging device, a CMOS (Complementary Metal Oxide Semiconductor) image sensor chip or a CCD (Charge Coupled Device) image sensor chip.

In the solid-state imaging device, plural pixels are arranged in an array shape on an imaging surface. In each of the pixels, a photoelectric conversion section is provided. The photoelectric conversion section is, for example, a photodiode. The photoelectric conversion section receives, on a light receiving surface, light made incident via an optical system including an external imaging lens and photoelectrically converts the light to generate signal charges.

The solid-state imaging device is manufactured in a form of, for example, a chip-size package. Specifically, a glass substrate is stuck to be opposed to one surface of a silicon wafer on which plural solid-state imaging components (sensor components) are provided. Partition walls are provided to divide, with an adhesive material, the solid-state imaging components adjacent to one another to stick the glass substrate. A through silicon via is formed in the silicon wafer to wire one surface and the other surface of the silicon wafer. After a bump is formed on the other surface, dicing is carried out to reduce the silicon wafer to a chip size. Consequently, the solid-state imaging device is manufactured in the form of the chip-size package.

In the solid-state imaging device, in order to improve image quality of a picked-up image, an optical filter is provided between the external imaging lens and the imaging surface. For example, an infrared cut filter for cutting an infrared ray other than visible light is arranged as the optical filter. This makes it possible to improve color reproducibility.

For example, a multilayer film is deposited on one surface of the glass substrate stuck in the chip-size package to provide an infrared cut filter layer, whereby the glass substrate is caused to function as the infrared cut filter (see, for example, JP-A-2001-203913 (e.g., paragraph [0014])).

SUMMARY

In order to satisfy spectral characteristics of visible light, the infrared cut filter layer including the multilayer film is formed by, for example, depositing thirty to sixty layers on one surface of the glass substrate to form a film. Therefore, the glass substrate could be warped by stress due to the film formation.

Therefore, it could be difficult to stick together the glass substrate on which the infrared cut filter layer including the multilayer film is provided and the silicon wafer on which pixels are provided. Besides, a problem could be caused in conveyance and chucking in forming the through silicon via.

In particular, when the infrared cut filter layer including the multilayer film is provided on a large glass substrate equal to or larger than an 8-inch square, a large warp tends to occur. For example, when a 12-inch glass substrate is used, a warp of several millimeters occurs. In this way, when the large glass substrate is used, occurrence of the deficiencies explained above becomes apparent.

When the infrared cut filter layer including the multilayer film is provided, the infrared cut filter layer could peel because of impact in a manufacturing process.

In particular, when the infrared cut filter layer including the multilayer film is provided on a surface of the glass substrate on the opposite side of a surface stuck to the silicon wafer, scratches could occur on the infrared cut filter layer in the conveyance and chucking. When a lens is bonded to a chip-size package, the infrared cut filter layer including the multilayer film could peel from an interface with the glass substrate. When the conveyance and chucking are performed while the glass substrate is supported on the surface on which the infrared cut filter layer is provided, the air could leak from a pattern of the infrared cut filter layer. Therefore, it could be difficult to improve manufacturing efficiency.

Besides, when the infrared cut filter includes other components, since different components are used, cost could increase. The thickness of the entire infrared cut filter could increase.

As explained above, when the glass substrate on which the infrared cut filter layer including the multilayer film is used, it is not easy to manufacture the device. It could be difficult to improve manufacturing efficiency. Further, reliability of the device could be deteriorated. Besides, it could be difficult to reduce the cost of the device and reduce the size of the device.

Therefore, it is desirable to provide a solid-state imaging device, a method of manufacturing the solid-state imaging device, and an electronic apparatus that make it possible to realize improvement of manufacturing efficiency, a reduction in cost, improvement of reliability, and a reduction in size.

An embodiment of the present disclosure is directed to a solid-state imaging device including: an optical filter in which a filter layer is formed on a transparent substrate; a solid-state imaging component that is arranged to be opposed to the optical filter and in which plural pixels that receive light made incident via the filter layer are arrayed in a pixel area of a semiconductor substrate; and a bonding layer that is provided between the optical filter and the solid-state imaging component and sticks the optical filter and the solid-state imaging component together. The filter layer is a dielectric multilayer film in which plural dielectric layers having a high refractive index and plural dielectric layers having a low refractive index are alternately stacked. The filter layer is formed to cover a portion corresponding to the pixel area and a part of an area located around the pixel area on a surface of the transparent substrate on a side opposed to the solid-state imaging component. The bonding layer is provided to be at least in contact with, in a peripheral portion of surfaces opposed to each other in the solid-state imaging component and the optical filter, a portion not covered by the filter layer and a peripheral portion of the filter layer on the transparent substrate.

Another embodiment is directed to a method of manufacturing a solid-state imaging device, including the steps of: forming an optical filter by forming a filter layer on a transparent substrate; forming a solid-state imaging component by providing, in a pixel area of a semiconductor substrate, plural pixels which receive light; and sticking the optical filter and the solid-state imaging component together by providing a bonding layer between the optical filter and the solid-state imaging component opposed to each other such that the pixels receive light made incident via the filter layer. In the step of forming an optical filter, the filter layer is formed by providing, to cover a portion corresponding to the pixel area and a part of an area located around the pixel area on a surface of the transparent substrate on a side opposed to the solid-state imaging component, a dielectric multilayer film in which plural dielectric layers having a high refractive index and plural dielectric layers having a low refractive index are alternately stacked. In the step of sticking the optical filter and the solid-state imaging component together, the optical filter and the solid-state imaging component are stuck together by providing the bonding layer to be at least in contact with, in a peripheral portion of a surface of the transparent substrate opposed to the semiconductor substrate, a portion not covered by the filter layer and a peripheral portion of the filter layer.

In the embodiments of the present disclosure, the filter layer is formed by covering, with the dielectric multilayer film, the portion corresponding to the pixel area and a part of the area located around the pixel area on the surface of the transparent substrate on the side opposed to the solid-state imaging component. The optical filter and the solid-state imaging component are stuck together by providing the bonding layer to be at least in contact with, in the peripheral portion of the surface opposed to the semiconductor substrate on the transparent substrate, the portion not covered by the filter layer and the peripheral portion of the filter layer.

According to the embodiments of the present disclosure, it is possible to provide a solid-state imaging device, a method of manufacturing the solid-state imaging device, and an electronic apparatus that make it possible to realize improvement of manufacturing efficiency, a reduction in cost, improvement of reliability, and a reduction in size.

BRIEF DESCRIPTION OF THE DRAWINGS

FIG. 18 is a diagram for explaining a method of manufacturing the infrared cut filter in the fourth embodiment of the present disclosure;

DETAILED DESCRIPTION

Embodiments of the present disclosure are explained below with reference to the accompanying drawings.

The embodiments are explained in order described below.

1. First Embodiment (a cavity structure)
2. Second Embodiment (a cavity-less structure)
3. Third Embodiment (stack plural registration patterns to form a filter layer)
4. Fourth Embodiment (a filter layer has a taper shape)

5. Fifth Embodiment (a three-dimensional mounting structure)

6. Others

1. First Embodiment

[1] Apparatus Configuration (1-1) Main Part Configuration of a Camera

Figure 1:
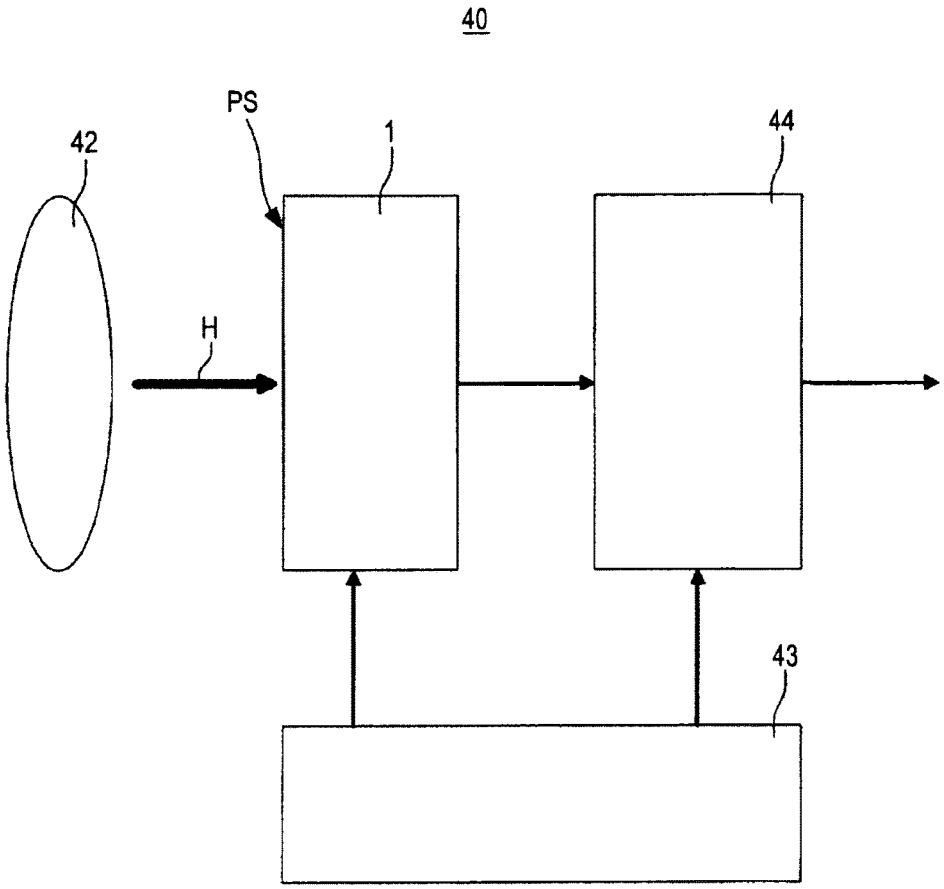
FIG. 1 is a configuration diagram of the configuration of a camera in a first embodiment according to the present disclosure.

FIG. 1 is a configuration diagram of the configuration of a camera 40 in a first embodiment of the present disclosure.

As shown in FIG. 1, the camera 40 includes a solid-state imaging device 1, an optical system 42, a control unit 43, and a signal processing unit 44. The units are explained below in order.

The solid-state imaging device 1 receives, on an imaging surface PS, incident light H made incident as a subject image via an optical system 42 and photoelectrically converts the incident light H to thereby generate signal charges. The solid-state imaging device 1 is driven on the basis of a control signal output from the control unit 43. The solid-state imaging device 1 reads out the signal charges and outputs the signal charges as an electric signal.

The optical system 42 includes optical members such as a focusing lens and an aperture and is arranged to condense the incident light H on the imaging surface PS of the solid-state imaging device 1.

The control unit 43 outputs various control signals to the solid-state imaging device 1 and the signal processing unit 44 and controls to drive the solid-state imaging device 1 and the signal processing unit 44.

The signal processing unit 44 carries out signal processing for the electric signal output from the solid-state imaging device 1 to thereby generate, for example, a color digital image.

(1-2) Main Part Configuration of the Solid-State Imaging Device

A main part configuration of the solid-state imaging device 1 is explained.

Figure 2:
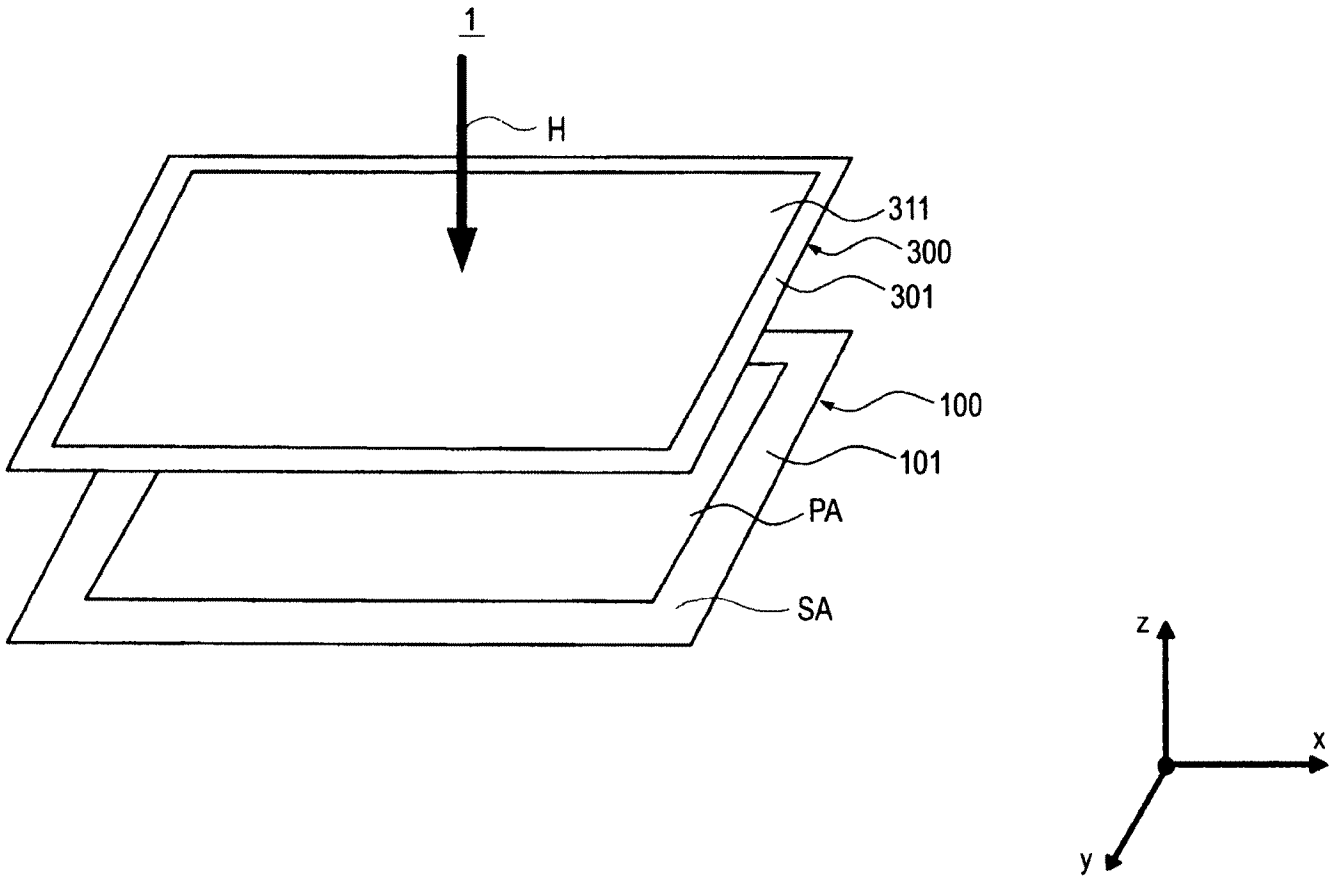
FIG. 2 is a diagram of a main part configuration of a solid-state imaging device in the first embodiment of the present disclosure.
Figure 3:
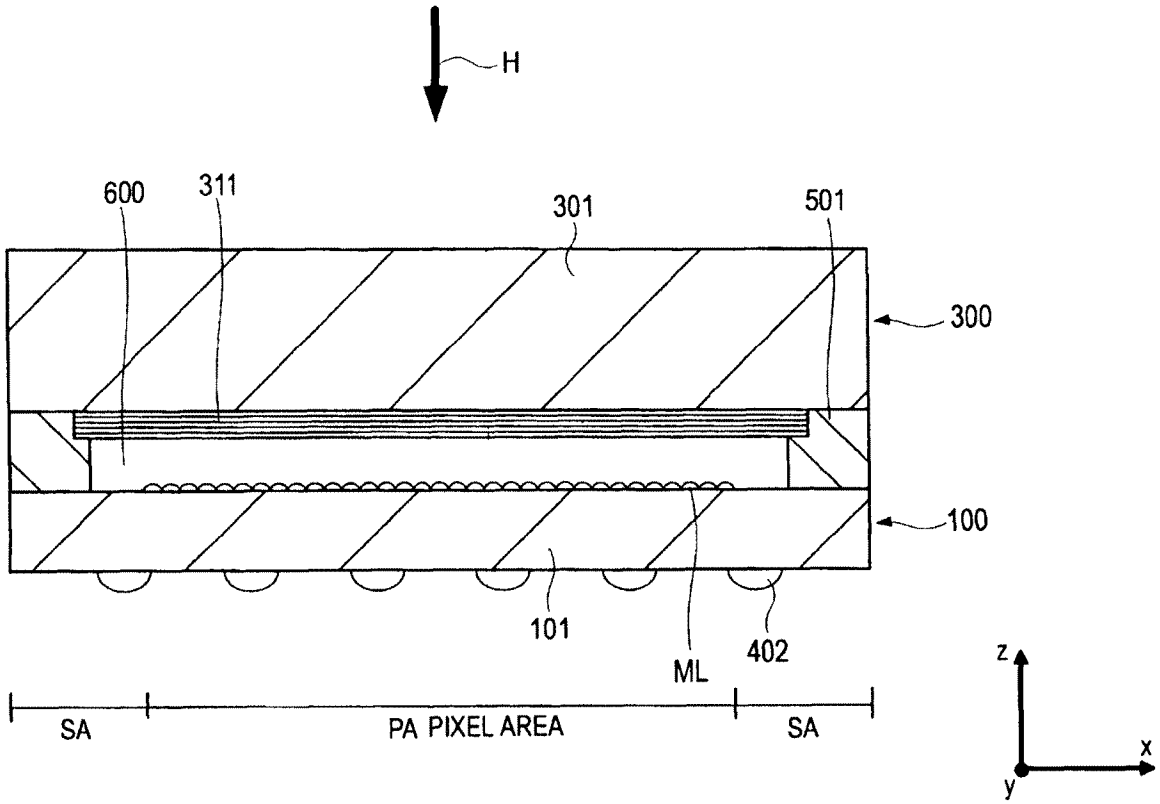
FIG. 3 is a diagram of a main part configuration of the solid-state imaging device in the first embodiment of the present disclosure.

FIGS. 2 and 3 are diagrams of the main part configuration of the solid-state imaging device 1 in the first embodiment according to the present disclosure.

FIG. 2 is a perspective view. FIG. 3 is a sectional view. FIGS. 2 and 3 schematically show the configuration of the solid state imaging device 1.

As shown in FIGS. 2 and 3, the solid-state imaging device 1 in this embodiment includes a sensor component 100, an infrared cut filter 300, and a bonding layer 501.

As shown in FIGS. 2 and 3, the sensor component 100 and the infrared cut filter 300 are arranged to be opposed to each other.

As shown in FIG. 3, a hollow cavity section 600 is provided in the center portion of surfaces in the sensor component 100 and the infrared cut filter 300 opposed to each other. The bonding layer 501 is provided in a peripheral portion of the surfaces of the sensor component 100 and the infrared cut filter 300 opposed to each other. The sensor component 100 and the infrared cut filter 300 are stuck together by the bonding layer 501.

The units included in the solid-state imaging device 1 are explained in order.

(a) Sensor Component 100

The sensor component 100 included in the solid-state imaging device 1 is explained.

As shown in FIGS. 2 and 3, in the solid-state imaging device 1, the sensor component 100 includes a semiconductor substrate 101. For example, the semiconductor substrate 101 is formed of a monocrystal silicon. A pixel area PA and a surrounding area SA are provided on a surface of the semiconductor substrate 101 opposed to the infrared cut filter 300. In the sensor component 100, pixels in the pixel area PA receive the incident light H in a visible light range made incident from above via the infrared cut filter 300 and the cavity section 600 and output the incident light H as an electric signal.

As explained in detail later, in the pixels in the pixel area PA, as shown in FIG. 3, micro lenses ML are provided. The sensor component 100 is stuck with the infrared cut filter 300 by the bonding layer 501.

(a-1) Overall Configuration of the Sensor Component 100

Figure 4:
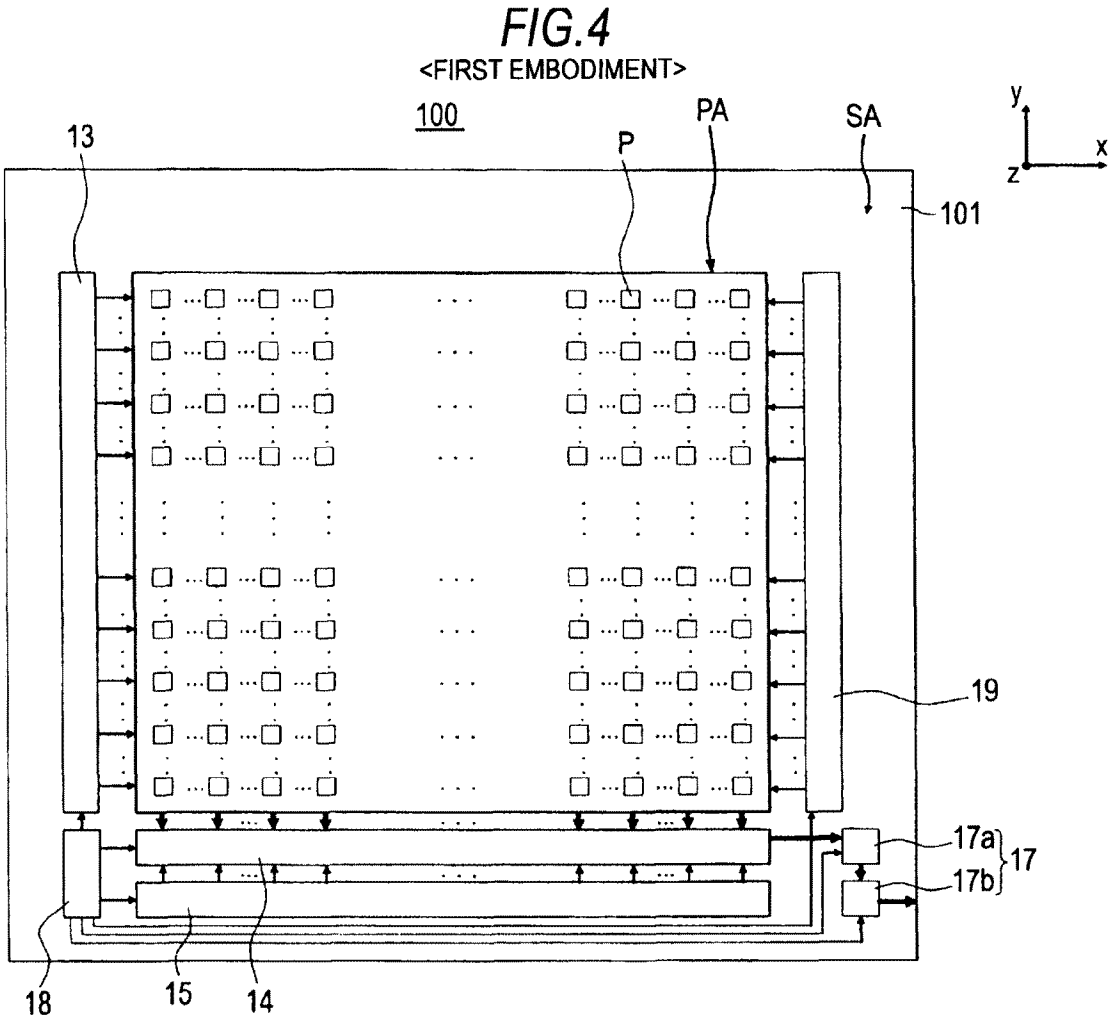
FIG. 4 is a diagram of an overall configuration of a sensor component in the first embodiment of the present disclosure.

FIG. 4 is a diagram of an overall configuration of the sensor component 100 in the first embodiment of the present disclosure. In FIG. 4, the upper surface of the sensor component 100 is shown.

In the sensor component 100, as shown in FIG. 4, the pixel area PA is provided in the center portion of the semiconductor substrate 101. The pixel area PA is formed in a rectangular shape. Plural pixels P are arranged in each of the horizontal direction x and the vertical direction y.

In the sensor component 100, as shown in FIG. 4, the surrounding area SA is located around the pixel area PA. In the surrounding area SA, peripheral circuits are provided.

Specifically, as shown in FIG. 4, a vertical driving circuit 13, a column circuit 14, a horizontal driving circuit 15, an external output circuit 17, a timing generator (TG) 18, and a shutter driving circuit 19 are provided as the peripheral circuits. The units are driven on the basis of a control signal input from the control unit 43 (see FIG. 1) and imaging operation is executed.

As shown in FIG. 4, the vertical driving circuit 13 is provided on a side of the pixel area PA in the surrounding area SA. The vertical driving circuit 13 selects the pixels P in the pixel area PA in a row unit and drives the pixels P.

As shown in FIG. 4, the column circuit 14 is provided at the lower end of the pixel area PA in the surrounding area SA. The column circuit 14 carries out signal processing for signals output from the pixels P in a column unit. The column circuit 14 includes a CDS (Correlated Double Sampling) circuit (not shown) and carries out signal processing for removing fixed pattern noise.

As shown in FIG. 4, the horizontal driving circuit 15 is electrically connected to the column circuit 14. The horizontal driving circuit 15 includes, for example, a shift register and sequentially outputs signals stored in each of columns of the pixels P in the column circuit 14 to the external output circuit 17.

As shown in FIG. 4, the external output circuit 17 is electrically connected to the column circuit 14. The external output circuit 17 carries out signal processing for a signal output from the column circuit 14 and then outputs the signal to the outside. The external output circuit 17 includes an AGC (Automatic Gain Control) circuit 17a and an ADC circuit 17b. In the external output circuit 17, after the AGC circuit 17a applies gain to the signal, the ADC circuit 17b converts the signal from an analog signal into a digital signal and outputs the signal to the outside.

As shown in FIG. 4, the timing generator 18 is electrically connected to the vertical driving circuit 13, the column circuit 14, the horizontal driving circuit 15, the external output circuit 17, and the shutter driving circuit 19. The timing generator 18 generates various timing signals and outputs the timing signals to the vertical driving circuit 13, the column circuit 14, the horizontal driving circuit 15, the external output circuit 17, and the shutter driving circuit 19 to perform driving control for the units.

The shutter driving circuit 19 selects the pixels P in a row unit and adjusts an exposure time in the pixels P.

(a-2) Main Part Configuration of the Sensor Component 100

Figure 5:
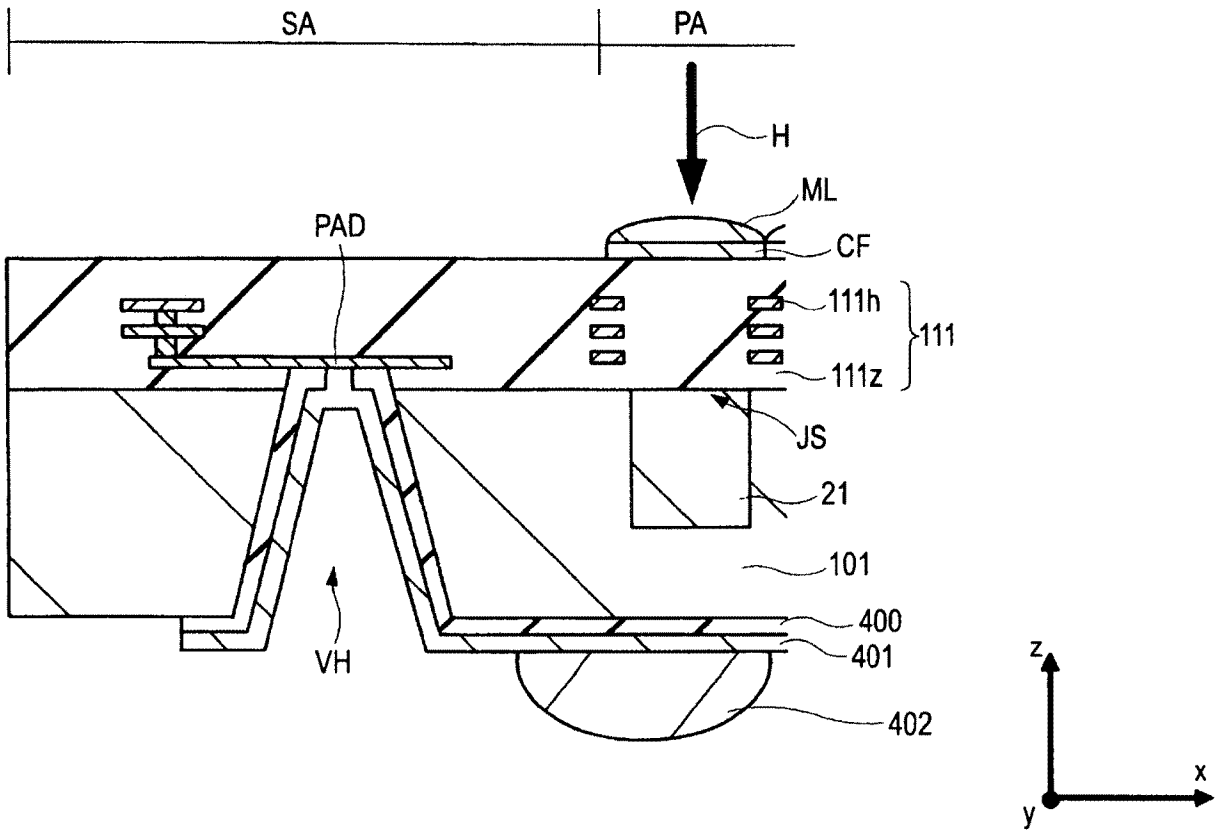
FIG. 5 is a diagram of a main part configuration of the sensor component in the first embodiment of the present disclosure.

FIG. 5 is a diagram of a main part configuration of the sensor component 100 in the first embodiment of the present disclosure. FIG. 5 shows apart of a cross section of the sensor component 100.

In the sensor component 100, as shown in FIG. 5, a wiring layer 111 is provided on the front surface (the upper surface) of the semiconductor substrate 101. The wiring layer 111 is a multilayer wiring layer and includes plural wires 111h and an insulating layer 111z. The wiring layer 111 is formed by alternately stacking the wires 111h and insulating films. The wires 111h are provided to be covered with the insulating layer 111z. In the wiring layer 111, a pad electrode PAD is provided in the surrounding area SA.

In the sensor component 100, as shown in FIG. 5, an insulating layer 400 and a conductive layer 401 are provided in order on the rear surface (the lower surface) of the semiconductor substrate 101. A bump 402 is provided on the lower surface of the conductive layer 401.

In the sensor component 100, in the pixel area PA, as shown in FIG. 5, a photodiode 21 is provided on the inside of the semiconductor substrate 101. In the pixel area PA, a color filter CF and a micro lens ML are provided on the upper surface of the wiring layer 111 in order. The photodiode 21, the color filter CF, and the micro lens ML are provided in each of the plural pixels P provided in the pixel area PA. The photodiode 21 receives the incident light H made incident from the front surface side of the semiconductor substrate 101 via the micro lens ML, the color filter CF, and the wiring layer 111. In other words, the solid-state imaging device in this embodiment is an image sensor chip of a "front-illuminated type". Details of the pixels P are explained later.

In the sensor component 100, in the surrounding area SA, as shown in FIG. 5, a via hole VH piercing through the semiconductor substrate 101 is provided. In other words, a through silicon via is provided. The via hole VH is formed to expose the lower surface of the pad electrode PAD provided in the wiring layer 111. The conductive layer 401 is coated on the inside of the via hole VH via the insulating layer 400. An opening is formed in the insulating layer 400 to expose a part of the lower surface of the pad electrode PAD. The conductive layer 401 is formed to bury the opening of the insulating layer 400 and electrically connected to the pad electrode PAD. In the surrounding area SA, semiconductor components included in the peripheral circuits shown in FIG. 4 are formed on the semiconductor substrate 101. However, the semiconductor components are not shown in FIG. 5.

(a-3) Configuration of the Pixel P

Figure 6:
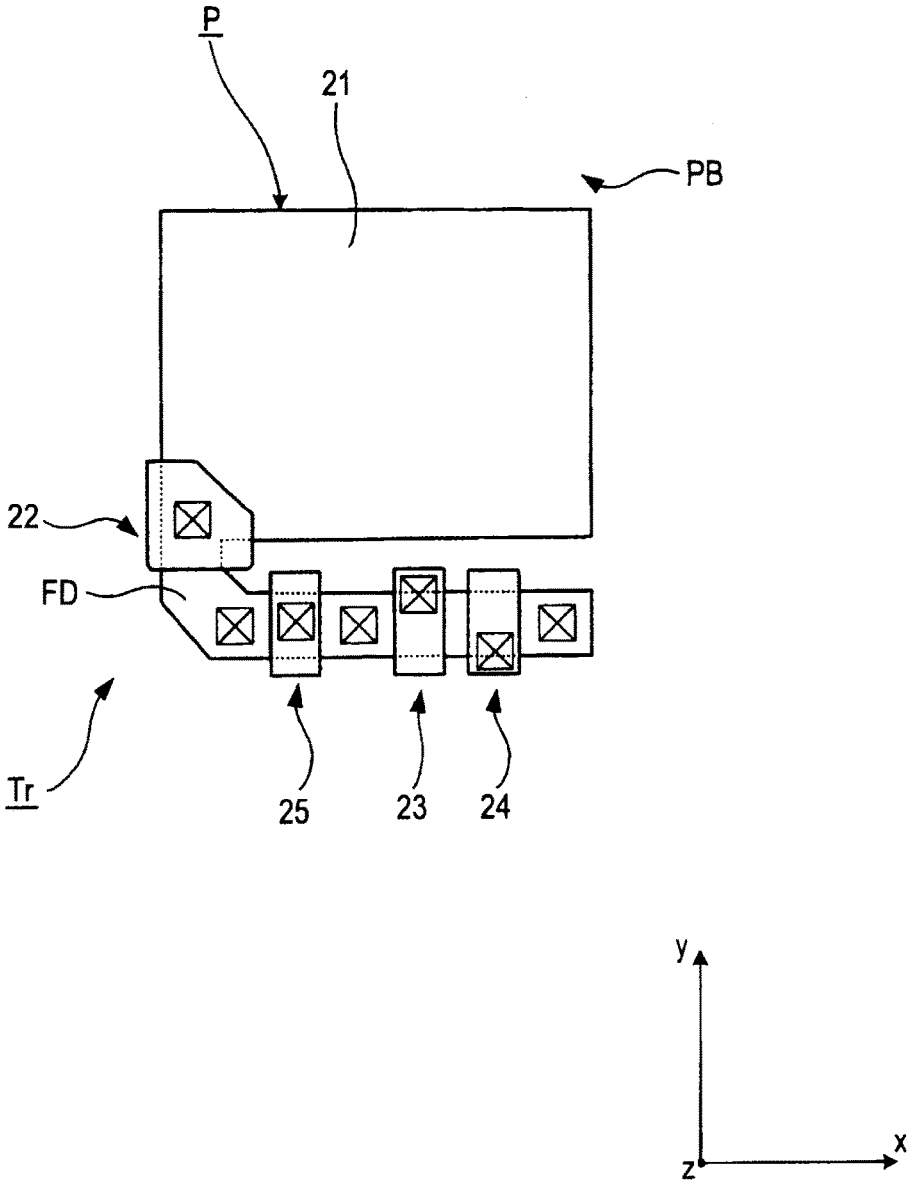
FIG. 6 is a diagram of a pixel P in the first embodiment of the present disclosure.
Figure 7:
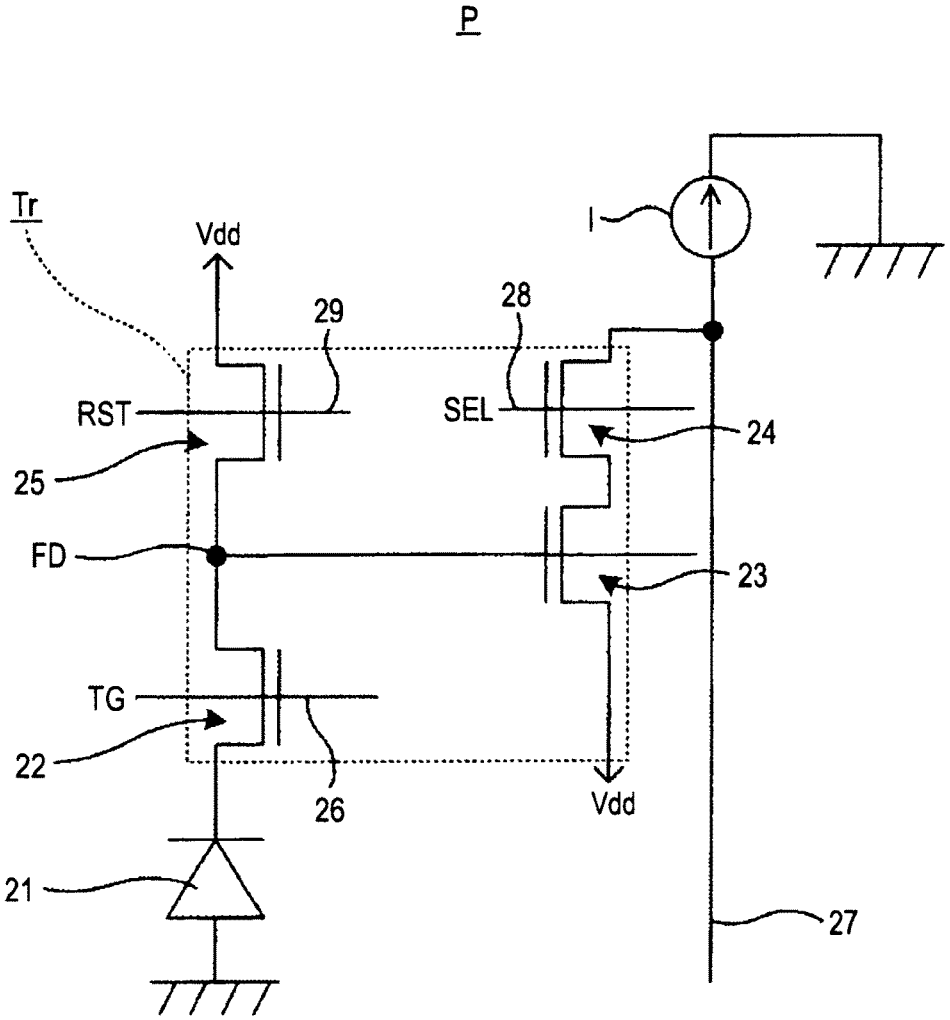
FIG. 7 is a diagram of the pixel P in the first embodiment of the present disclosure.

FIGS. 6 and 7 are diagrams of the pixel P in the first embodiment of the present disclosure.

FIG. 6 is a plan view of the pixel P. FIG. 7 is a diagram of a circuit configuration of the pixel P.

As shown in FIGS. 6 and 7, the pixel P includes a pixel transistor Tr besides the photodiode 21 shown in FIG. 5. The pixel transistor Tr includes a transfer transistor 22, an amplification transistor 23, a selection transistor 24, and a reset transistor 25. The pixel transistor Tr carries out operation for reading out signal charges from the photodiode 21.

In the pixel P, plural photodiodes 21 are arranged to correspond to the plural pixels P shown in FIG. 4. In other words, on an imaging surface (an xy plane), the photodiodes 21 are provided side by side in each of the horizontal direction x and the vertical direction y orthogonal to the horizontal direction x. For example, the photodiode 21 includes a charge accumulation area (not shown) in which n-type impurities are diffused on the inside of the semiconductor substrate 101. A hole accumulation area (not shown) in which p-type impurities are diffused is formed to suppress occurrence of dark current on interfaces on the upper surface side and the lower surface side of the n-type charge accumulation area.

As shown in FIG. 6, a pixel separation section PB that electrically separates the plural pixels P is arranged around the pixel P. The photodiode 21 is provided in an area divided by the pixel separation section PB. For example, the pixel separation section PB is formed by diffusing p-type impurities in the semiconductor substrate 101 (see FIGS. 4 and 5, etc.).

As shown in FIG. 7, an anode of the photodiode 21 is grounded. Signal charges (electrons) accumulated in the photodiode 21 are read out by the pixel transistor Tr and output to a vertical signal line 27 as an electric signal. Specifically, as shown in FIG. 6, the photodiode 21 is connected to a gate of the amplification transistor 23 via the transfer transistor 22. In the photodiode 21, the accumulated signal charges are transferred to a floating diffusion FD connected to the gate of the amplification transistor 23 as an output signal by the transfer transistor 22.

In the pixel P, plural pixel transistors Tr are arranged to correspond to the plural pixels P shown in FIG. 4. For example, as shown in FIG. 6, the pixel transistor Tr is formed in the pixel separation section PB that separates the pixels P on the semiconductor substrate 101.

Although not shown in FIG. 4, the pixel transistor Tr is provided on the surface covered by the wiring layer 111 on the semiconductor substrate 101. The transistors 22 to 25 included in the pixel transistor Tr are N-channel MOS transistors. Gates of the transistors 22 to 25 are formed using, for example, polysilicon. The transistors 22 to 25 are covered with the wiring layer 111.

In the pixel transistor Tr, the transfer transistor 22 transfers signal charges generate by the photodiode 21 to the floating diffusion FD. Specifically, as shown in FIG. 7, the transfer transistor 22 is provided to be interposed between the photodiode 21 and the floating diffusion FD. When a transfer signal TG is transmitted from a transfer line 26 to a gate of the transfer transistor 22 and the transfer transistor 22 is turned on, the transfer transistor 22 transfers the signal charges accumulated by the photodiode 21 to the floating diffusion FD.

In the pixel transistor Tr, the amplification transistor 23 amplifies a signal by the signal charges transferred by the transfer transistor 22 and outputs the signal. Specifically, as shown in FIG. 7, the gate of the amplification transistor 23 is connected to the floating diffusion FD. A drain of the amplification transistor 23 is connected to a power supply potential supply line Vdd and a source of the amplification transistor 23 is connected to the selection transistor 24. When the selection transistor 24 is selected to be turned on, a constant current is supplied to the amplification transistor 23 from a constant current source I and the amplification transistor 23 operates as a source follower. Therefore, a selection signal SEL is supplied to the selection transistor 24, whereby the signal by the transferred signal charges is amplified in the amplification transistor 23.

In the pixel transistor Tr, the selection transistor 24 outputs an electric signal from the pixel P to the vertical signal line 27 on the basis of the selection signal SEL.

Specifically, as shown in FIG. 7, a gate of the selection transistor 24 is connected to an address line 28 to which the selection signal SEL is supplied. When the selection transistor 24 is supplied with the selection signal SEL and turned on, the output signal amplified by the amplification transistor 23 as explained above is output to the vertical signal line 27.

In the pixel transistor Tr, the reset transistor 25 resets the gate potential of the amplification transistor 23. Specifically, as shown in FIG. 7, a gate of the reset transistor 25 is connected to a reset line 29 to which a reset signal RST is supplied. A drain of the reset transistor 25 is connected to the power supply potential supply line Vdd and a source of the reset transistor 25 is connected to the floating diffusion FD. When the reset signal is supplied to the gate of the reset transistor 25 from the reset line 29 and the reset transistor 25 is turned on, the reset transistor 25 resets the gate potential of the amplification transistor 23 to a power supply potential via the floating diffusion FD.

The wires such as the transfer line 26, the address line 28, the vertical signal line 27, and the reset line 29 shown in FIG. 7 are equivalent to the wire 111h included in the wiring layer 111 shown in FIG. 5.

As explained above, in the pixels P, the color filters CF and the micro lenses ML are provided.

In the pixel P, the color filter CF colors the incident light H and transmits the incident light H to alight receiving surface JS of the semiconductor substrate 101. For example, the color filter CF is formed by applying application liquid containing a coloring pigment and photoresist resin with a coating method such as a spin coat method to form a coating film and then patterning the coating film with a lithograph technique.

Figure 8:
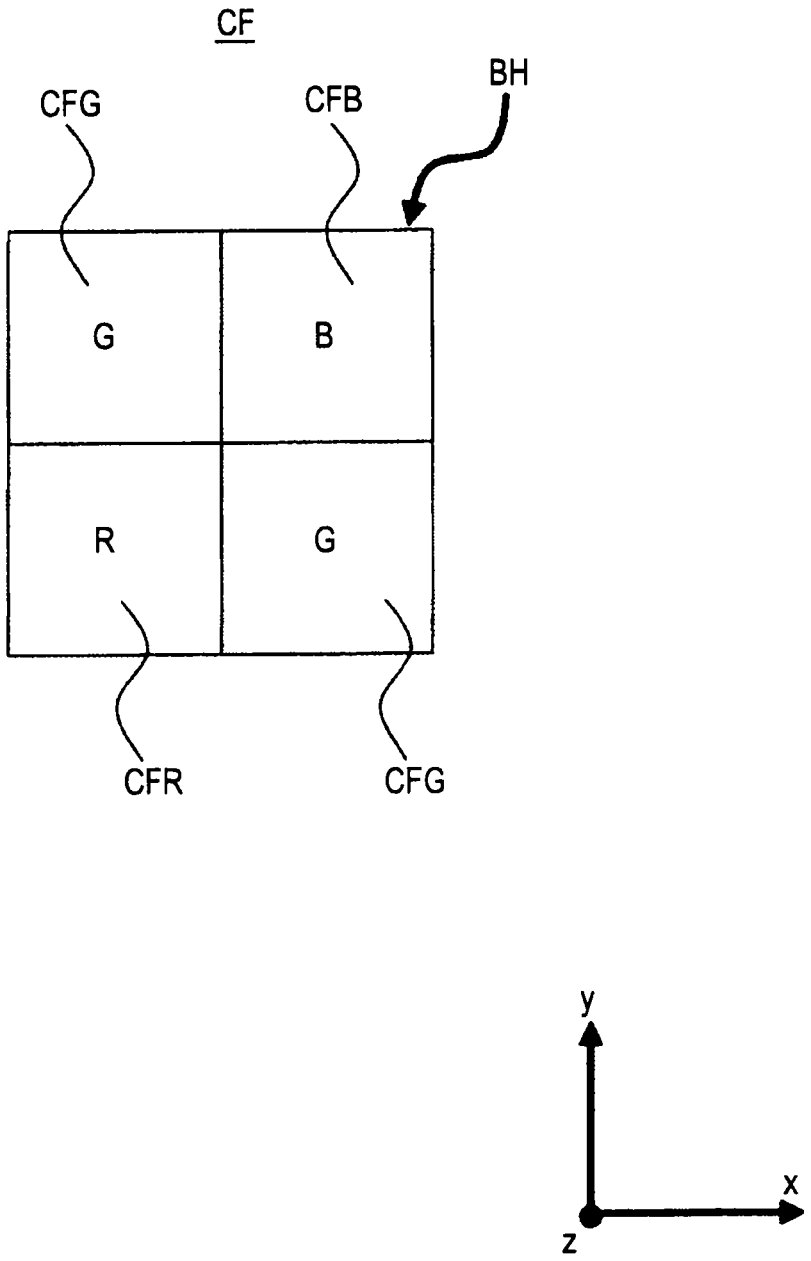
FIG. 8 is a diagram of a color filter CF in the first embodiment of the present disclosure.

FIG. 8 is a diagram of the color filter CF in the first embodiment of the present disclosure. In FIG. 8, the upper surface of the color filter CF is shown.

As shown in FIG. 8, the color filter CF includes a red filter layer CFR, a green filter layer CFG, and a blue filter layer CFB. The red filter layer CFR, the green filter layer CFG, and the blue filter layer CFB are adjacent to one another. Any one of the red filter layer CFR, the green filter layer CFG, and the blue filter layer CFB is provided to correspond to each of the plural pixels P.

As shown in FIG. 8, the red filter layer CFR, the green filter layer CFG, and the blue filter layer CFB are arranged side by side in a Bayer array BH. In other words, plural green filters CFG are arranged side by side in a diagonal direction to form a checkered pattern. The red filter layer CFR and the blue filter layer CFB are arranged side by side in a diagonal direction with respect to the plural green filter layers CFG.

In the pixel P, as shown in FIG. 5, the micro lens ML is provided on the upper surface of the color filter CF. The micro lens ML is a convex lens, the center of which is formed thicker than the edge, above the light receiving surface JS. The micro lens ML condenses the incident light H on the light receiving surface JS of the photodiode 21. For example, the micro lens ML is formed using an organic resin material having a refractive index of about 1.6. The micro lens ML is formed by patterning a photosensitive resin film with a photolithography technique and then deforming the photosensitive resin film into a lens shape with reflow processing. Besides, the micro lens ML may be formed by forming a resist film having a lens shape on a lens material film and then carrying out etch-back processing.

Figure 9:
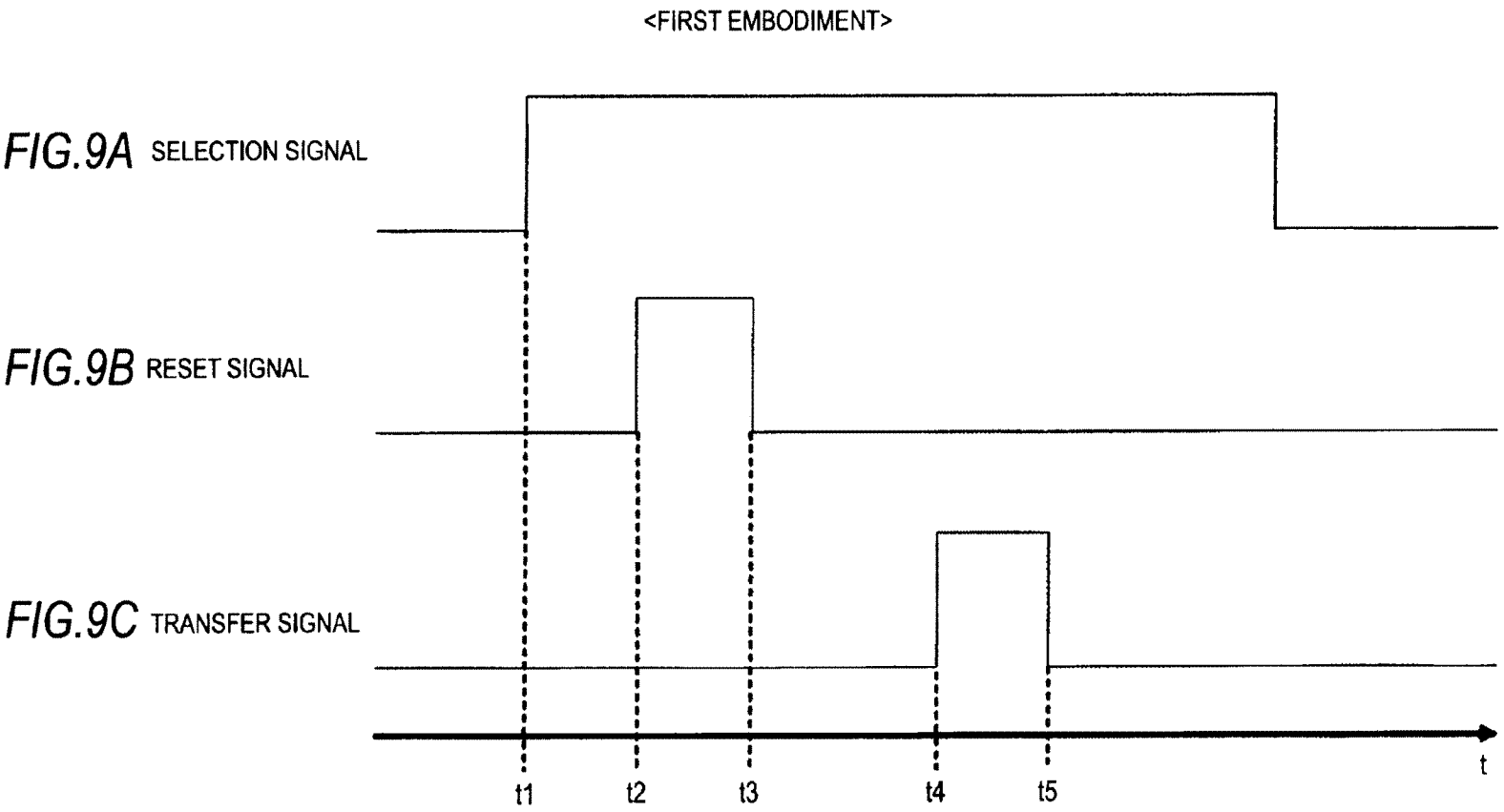
FIGS. 9A to 9C are timing charts of pulse signals supplied to units when a signal is read out from the pixel P in the first embodiment of the present disclosure.

FIGS. 9A to 9C are timing charts of pulse signals supplied to the units when a signal is read out from the pixel P in the first embodiment of the present disclosure. (a) indicates the selection signal SEL, (b) indicates the reset signal RST, and (c) indicates the transfer signal TG (see FIG. 7).

First, as shown in FIGS. 9A to 9C, at first point of time t1, the selection signal is changed to a high level to set the selection transistor 24 in a conduction state. At second point of time t2, the reset signal is changed to the high level to set the reset transistor 25 in the conduction state. Consequently, the gate potential of the amplification transistor 23 is reset.

Subsequently, at third point of time t3, the reset signal is changed to a low level to set the reset transistor 25 in a non-conduction state. Thereafter, a voltage corresponding to the reset level is read out to the column circuit 14.

At fourth point of time t4, the transfer signal is changed to the high level to set the transfer transistor 22 in the conduction state. Signal charges accumulated in the photodiode 21 are transferred to the floating diffusion FD.

At fifth point of time t5, the transfer signal is changed to the low level to set the transfer transistor 22 in the non-conduction state. Thereafter, a voltage of a signal level corresponding to an amount of the accumulated signal charges is read out to the column circuit 14.

The column circuit 14 subjects the reset level read out earlier and the signal level read out later to differential processing and accumulates signals. Consequently, fixed pattern noise caused by, for example, fluctuation in Vth of the transistors provided for each of the pixels P is cancelled.

Since the gates of the transistors 22, 24, and 25 are connected in a row unit including the plural pixels P arranged side by side in the horizontal direction x, the operation for driving the pixels as explained above is simultaneously performed for the plural pixels P arranged side by side in the row unit. Specifically, the pixels are sequentially selected in the vertical direction in a horizontal line (pixel row) unit according to the selection signal supplied by the vertical driving circuit 13. The transistors of the pixels are controlled by various timing signals output from the timing generator 18. Consequently, output signals in the pixels P are read out to the column circuit 14 for each pixel column through the vertical signal line 27.

Signals accumulated by the column circuit 14 are selected by the horizontal driving circuit 15 and sequentially output to the external output circuit 17.

(b) Infrared Cut Filter 300

The infrared cut filter 300 included in the solid-state imaging device 1 is explained.

As shown in FIGS. 2 and 3, in the solid-state imaging device 1, the infrared cut filter 300 includes a glass substrate 301. In the glass substrate 301, an infrared cut filter layer 311 is provided on a surface opposed to the sensor component 100.

As shown in FIGS. 2 and 3, the infrared cut filter layer 311 is provided in the center portion of the glass substrate 301. The infrared cut filter layer 311 is rectangular in a plane shape. The infrared cut filter layer 311 is formed to cover an entire area corresponding to the pixel area PA of the sensor component 100 on the glass substrate 301. The infrared cut filter layer 311 is also formed to cover a part of an area corresponding to the surrounding area SA of the sensor component 100 on the glass substrate 301.

In other words, the infrared cut filter layer 311 is formed to cover an area larger than the area corresponding to the pixel area PA of the sensor component 100 on the glass substrate 301. The infrared cut filter layer 311 is also formed to cover, without covering an entire area opposed to the sensor component 100, an area smaller than the opposed area on the glass substrate 301.

The infrared cut filter layer 311 is a dielectric multilayer film. Specifically, in the infrared cut filter layer 311, dielectric layers having a high refractive index and dielectric layer having a low refractive index are alternately stacked. The infrared cut filter layer 311 reflects and cuts light in an infrared region through interference action of the layers and selectively transmits light in a visible region.

(c) Bonding Layer 501

The bonding layer 501 included in the solid-state imaging device 1 is explained.

As shown in FIG. 3, the bonding layer 501 is provided in a peripheral portion of surfaces of the sensor component 100 and the infrared cut filter 300 opposed to each other. In other words, the bonding layer 501 is provided around the cavity section 600 between the sensor component 100 and the infrared cut filter 300 and sticks the sensor component 100 and the infrared cut filter 300 together.

In this embodiment, the bonding layer 501 is provided in contact with a peripheral portion not covered with the infrared cut filter layer 311 on the glass substrate 301 of the infrared cut filter 300. At the same time, the bonding layer 501 is provided in contact with a peripheral portion of the infrared cut filter layer 311 on the infrared cut filter 300. Specifically, the bonding layer 501 is provided in contact with a side end face of the infrared cut filter layer 311 and a side end of a surface of the infrared cut filter layer 311 opposed to the sensor component 100.

(2) Manufacturing Method

A main part of a manufacturing method for manufacturing the solid-state imaging device 1 is explained below.

Figure 10:
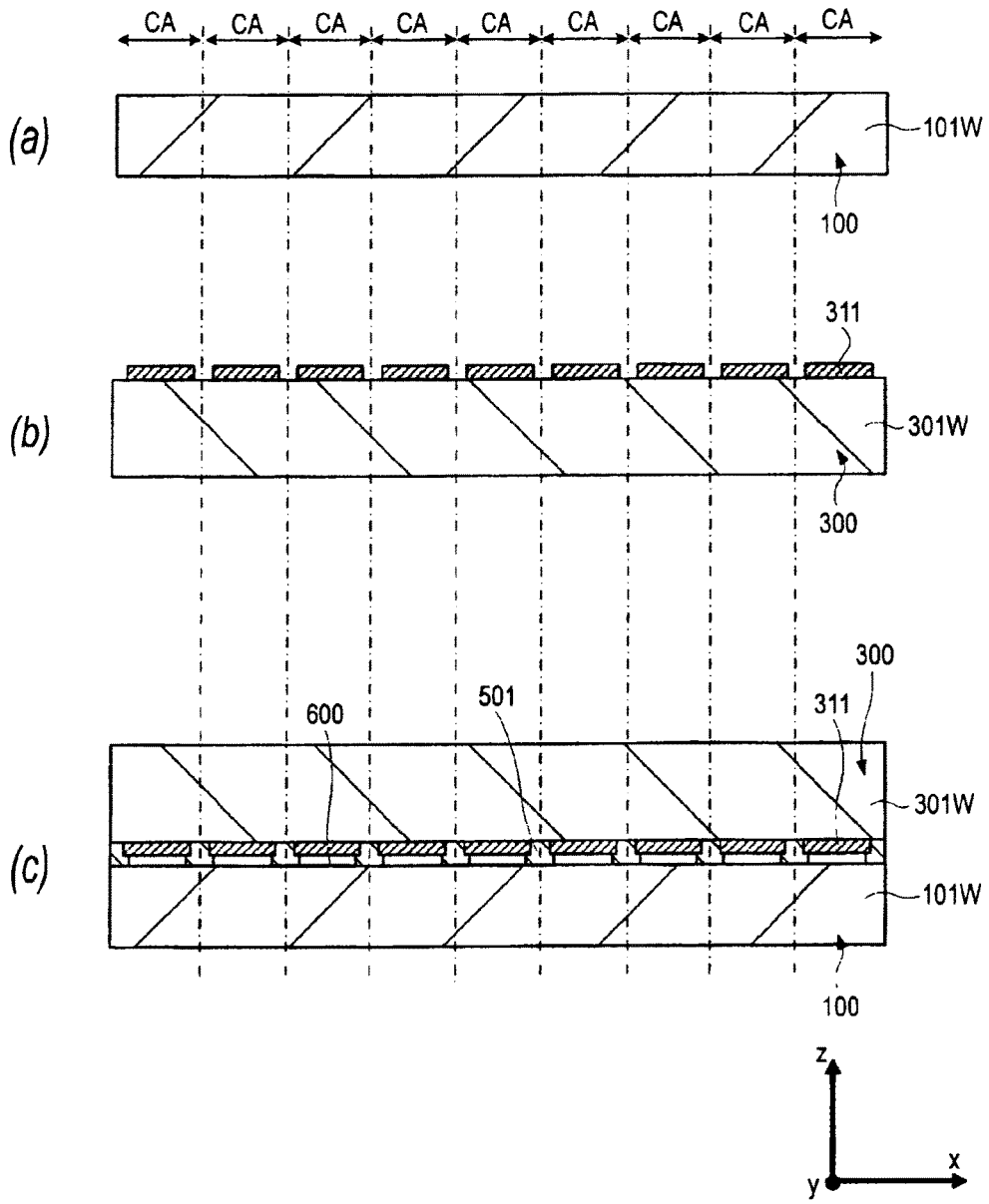
FIG. 10 is a diagram for explaining a method of manufacturing a solid-state imaging device in the first embodiment of the present disclosure.
Figure 11:
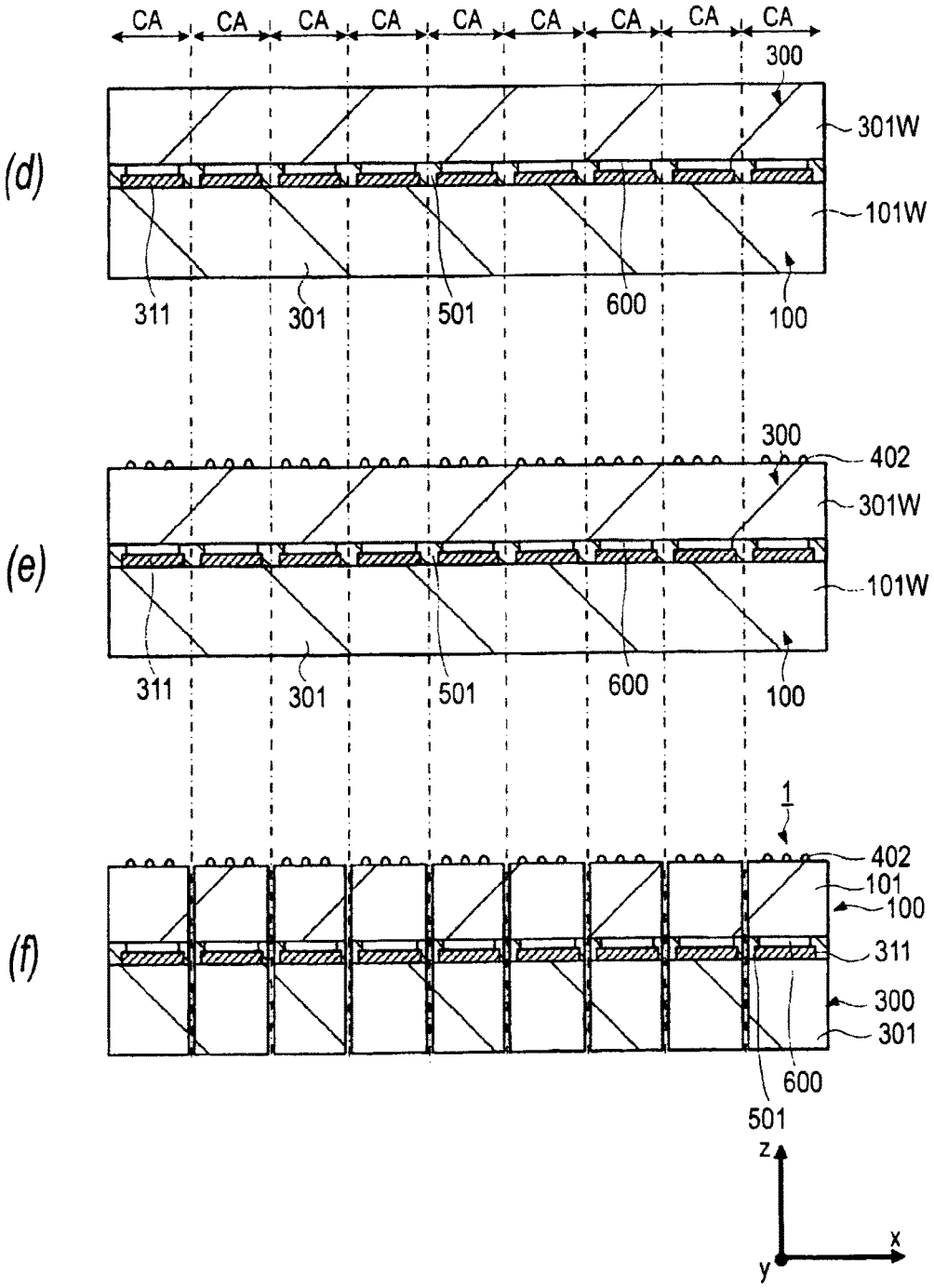
FIG. 11 is a diagram for explaining the method of manufacturing a solid-state imaging device in the first embodiment of the present disclosure.

FIGS. 10 and 11 are diagrams for explaining a method of manufacturing a solid-state imaging device in the first embodiment of the present disclosure.

FIGS. 10 and 11 show, in order, steps of manufacturing a solid-state imaging device.

In this embodiment, as shown in FIGS. 10 and 11, a large disk-like wafer on which plural solid-state imaging devices 1 are provided is divided to manufacture one solid-state imaging device 1 through steps (a) to (f).

Details of the steps are explained.

(a) Formation of the Sensor Component 100

First, the sensor component 100 is formed as shown in step (a) in FIG. 10.

As shown in step (a) in FIG. 10, plural sensor components 100 are provided on a large semiconductor wafer 101W (silicon wafer).

Specifically, the units such as the pixel P are appropriately provided in each of areas CA, where plural solid-state imaging devices are provided on the semiconductor wafer 101W, to provide the plural sensor components 100.

(b) Formation of the Infrared Cut Filter 300

Subsequently, the infrared cut filter 300 is formed as shown in step (b) in FIG. 10.

As shown in step (b) in FIG. 10, plural infrared cut filters 300 are formed on a large glass wafer 301W.

Specifically, the infrared cut filter layer 311 is provided in each of the areas CA, where plural solid-state imaging devices are provided, on a surface of the glass wafer 301W opposed to the sensor component 100 to form the plural infrared cut filters 300.

For example, a glass wafer having a coefficient of linear expansion same as that of the semiconductor wafer 101W is used as the glass wafer 301W. For example, a glass wafer having a value of a coefficient of linear expansion (CTE=3.2 ppm) same as that of the semiconductor wafer 101W and having thickness of 500 μm is used as the glass wafer 301W. Besides, a glass wafer having a value of a coefficient of linear expansion (CTE=2.9 to 3.5 ppm) close to that of the semiconductor wafer 101W is also suitably used.

The infrared cut filter layer 311 is provided in a state in which the glass wafer 301W is supported by a manufacturing apparatus on a surface of the glass wafer 301W on the opposite surface of the surface opposed to the sensor component 100. In other words, the glass wafer 301W is supported on a surface of the glass wafer 301W on the opposite side of the surface on which the infrared cut filter layer 311 is provided. For example, the glass wafer 301W is supported by a vacuum chuck, an electrostatic chuck, or a mechanical chuck. The glass wafer 301W is supported on the surface and conveyed.

Figure 12:
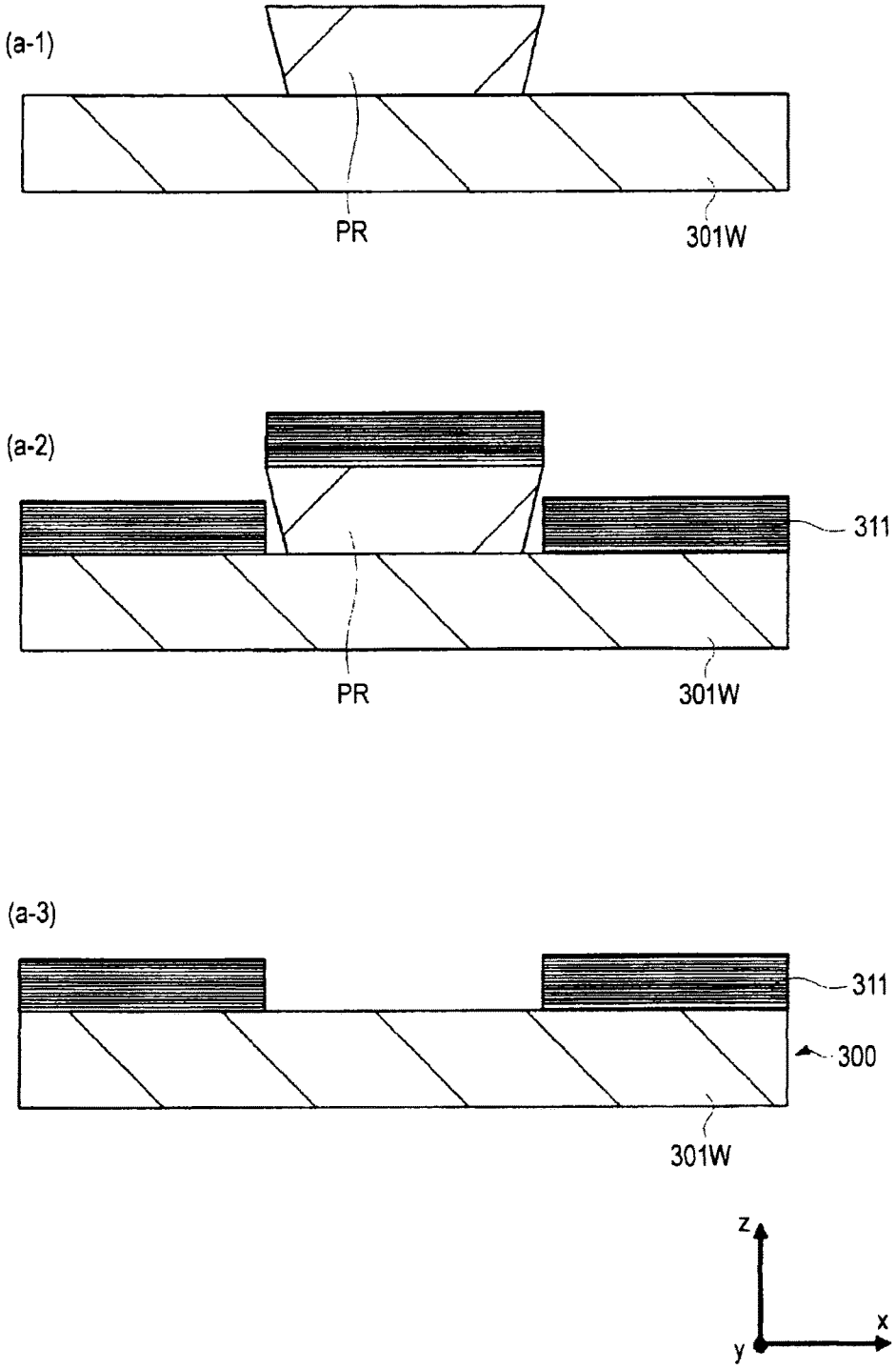
FIG. 12 is a diagram for explaining a method of manufacturing an infrared cut filter in the first embodiment of the present disclosure.

FIG. 12 is a diagram for explaining a manufacturing method for forming the infrared cut filter 300 in the first embodiment of the present disclosure.

FIG. 12 shows, in order, steps for forming the infrared cut filter 300.

In this embodiment, as shown in FIG. 12, the infrared cut filter layer 311 is formed on the glass wafer 301W through steps (a1) to (a3). In other words, the infrared cut filter layer 311 is formed by a lift-off method.

Specifically, first, as shown in step (a1) in FIG. 12, a photoresist pattern PR is provided.

The photoresist pattern PR is formed to be located above an area other than an area where the infrared cut filter layer 311 is formed on the upper surface of the glass wafer 301W.

For example, after a photosensitive resin film (not shown) is formed on the upper surface of the glass wafer 301W, the photosensitive resin film (not shown) is patterned by the photolithography technique to form the photoresist pattern PR.

In this embodiment, the photoresist pattern PR is formed to have a sectional shape having small width on a side close to the glass wafer 301W and gradually having larger width farther away from the glass wafer 301W. In other words, the photoresist pattern PR is formed such that a cross section thereof is formed in a reverse taper shape.

For example, the photoresist pattern PR is formed to satisfy conditions explained below.

Conditions for the Photoresist Pattern PR

Thickness: 6.5 μm to 11 μm (The thickness needs to be larger than the thickness of the dielectric multilayer film formed as the infrared cut filter layer 311 by stacking thirty to sixty layers. The layers of the dielectric multilayer film need to have thickness of ¼λ. When averaged, the thickness of each of the layers is 150 nm (600 nm/4). Therefore, the thickness of the dielectric multilayer film is 4.5 μm to 9 μm. The photoresist pattern PR is suitably formed thicker than the thickness of the dielectric multilayer film by about 2 μm.)

Angle of inclination: 87° to 89°

Material: Resist for lift-off

Distance among photoresist patterns PR: 50 μm to 800 μm (Because remaining width after dicing is necessary for bonding strength. Before dicing, dicing street width 30 μm to 100 μm+(min 50 to 300×2))

As shown in step (a2) in FIG. 12, the infrared cut filter layer 311 is formed.

The infrared cut filter layer 311 is formed to cover the upper surface of the glass wafer 301W on which the photoresist pattern PR is formed. Consequently, the infrared cut filter layer 311 is formed on the upper surface of the photoresist pattern PR as well as on the upper surface of the glass wafer 301W.

Specifically, a dielectric multilayer film in which high-refractive index layers and low-refractive index layers are alternately stacked is formed to form the infrared cut filter layer 311.

For example, the high-refractive index layers are formed using a material such as $TiO_2$, $Ta_2O_5$, or $Nb_2O_5$. The low-refractive index layers are formed using a material such as $SiO_2$ or $MgF_2$. For example, thirty to sixty layers of the high-refractive index layers and the low-refractive index layers are stacked to form the infrared cut filter layer 311. For example, the high-refractive index layers and the low-refractive index layers are formed by a physical film formation method such as a vacuum vapor deposition method, ion assist deposition, an ion plating method, or a sputtering method.

Subsequently, as shown in step (a3) in FIG. 12, the photoresist pattern PR is removed.

The photoresist pattern PR, on the upper surface of which the infrared cut filter layer 311 is formed as explained above, is removed. Consequently, the infrared cut filter layer 311 is formed in a desired pattern on the upper surface of the glass wafer 301W. Specifically, as shown in FIG. 3, the infrared cut filter layer 311 is formed to cover a portion corresponding to the pixel area PA and a part of the surrounding area SA on the surface opposed to the glass substrate 301 when the glass substrate 301 is stuck to the sensor component 100.

Figure 13:
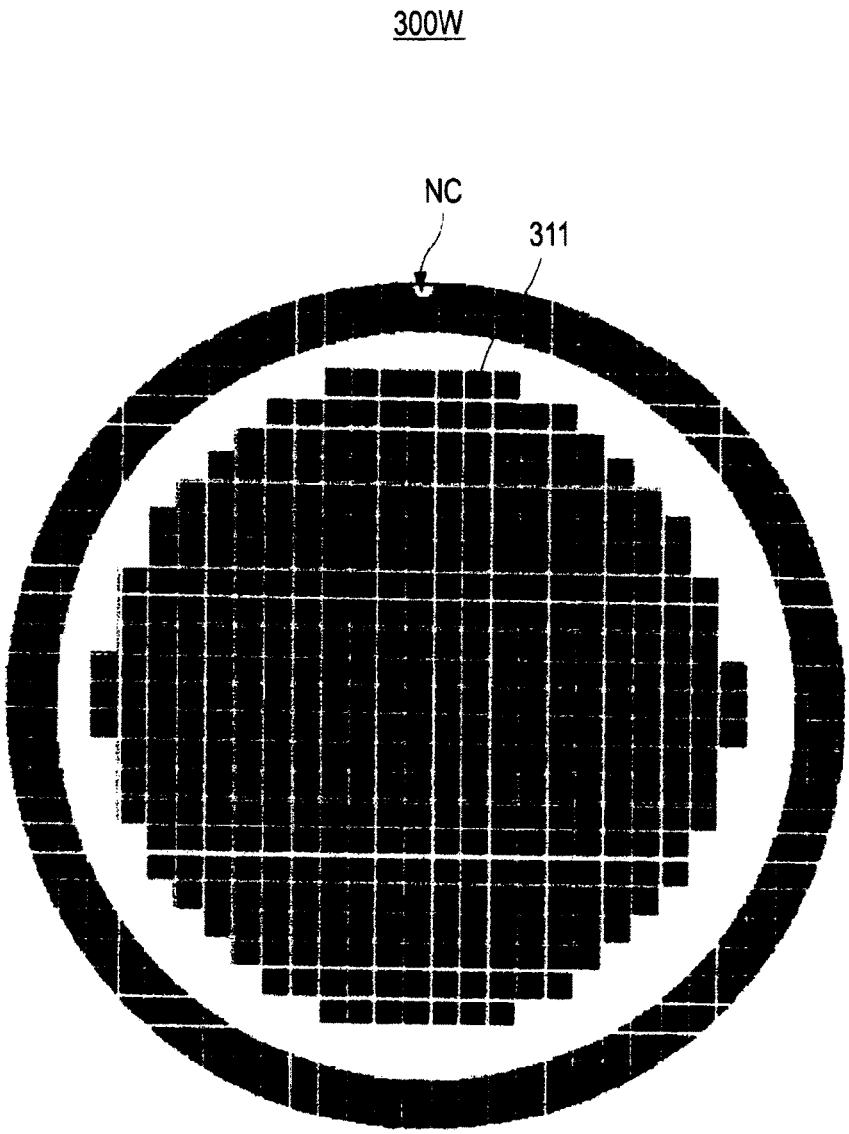
FIG. 13 is a diagram of the upper surface of the infrared cut filter before dicing in the first embodiment of the present disclosure.

FIG. 13 is a diagram of the upper surface of the glass wafer on which the infrared cut filter layer 311 is formed in the first embodiment of the present disclosure. FIG. 13 shows the upper surface of the infrared cut filter 300 before dicing. In FIG. 13, a portion where the infrared cut filter layer 311 is formed is indicated by black and a portion where the infrared cut filter layer 311 is not formed is indicated by white.

As shown in FIG. 13, the infrared cut filter layer 311 is provided in each of the areas CA where the plural solid-state imaging devices are provided on the upper surface of the glass wafer 301W. Each of plural infrared cut filter layers 311 is formed to have a gap interposed between the infrared cut filter layers 311.

As shown in FIG. 13, a notch pattern NC for alignment may be formed in the circumference of the glass wafer 301W. For example, the notch pattern NC is suitably formed in a shape same as the shape of a silicon wafer for forming the sensor component 100. Consequently, special mark detection is unnecessary in alignment of the silicon wafer and the notch pattern NC. In other words, it is possible to align the silicon wafer and the notch pattern NC through detection by positioning and rotation of an external shape by an alignment mechanism of an apparatus. It is possible to perform alignment with an inexpensive apparatus configuration without changing an alignment method for each model.

(c) Sticking Together of the Sensor Component 100 and the Infrared Cut Filter 300

Subsequently, as shown in step (c) in FIG. 10, the sensor component 100 and the infrared cut filter 300 are stuck together.

The top and the bottom of the glass wafer 301W on which the infrared cut filter 300 is provided are reversed. Thereafter, the upper surface of the supported semiconductor wafer 101W and the lower surface of the glass wafer 301W on which the infrared cut filter layer 311 is provided are set opposed to each other. Then, the semiconductor wafer 101W and the glass wafer 301W are aligned and stuck together. In other words, the glass substrate 301 and the semiconductor substrate 101 are aligned and stuck together such that each of the plural infrared cut filters 300 and each of the plural sensor components 100 correspond to each other.

Specifically, in each of the areas CA where the plural solid-state imaging devices are provided, the sensor component 100 and the infrared cut filter 300 are stuck together such that the hollow cavity section 600 is provided in the center portion of the surfaces of the sensor component 100 and the infrared cut filter 300 opposed to each other.

In each of the areas CA where the plural solid-state imaging devices are provided, the sensor component 100 and the infrared cut filter 300 are stuck together by providing the bonding layer 501 in a peripheral portion of the surfaces of the sensor component 100 and the infrared cut filter 300 opposed to each other.

For example, after the bonding layer 501 is formed in a lattice shape to divide the areas CA where the plural solid-state imaging devices are provided on the surface of the semiconductor wafer 101W, the glass wafer 301W is aligned and stuck with the semiconductor wafer 101W.

For example, the bonding layer 501 is formed to satisfy conditions explained below.

Conditions for the Bonding Layer 501

Thickness: 10 μm to 70 μm (Actually, 50 μm. Because interference fringes due to diffraction occurs if the bonding layer 501 is thin)

Width: At least about 200 μm

Material: Photosensitive acrylic epoxy adhesive

Consequently, as shown in FIG. 3, the bonding layer 501 is provided between the sensor component 100 and the infrared cut filter 300 opposed to each other such that the pixels receive light made incident via the infrared cut filter layer 311 and the cavity section 600 in a state in which the sensor component 100 and the infrared cut filter 300 are stuck together. In other words, in this step, the sensor component 100 and the infrared cut filter 300 are stuck together by providing the bonding layer 501 in contact with a portion not covered with the infrared cut filter layer 311 which is a peripheral portion of the surface of the glass substrate 301 opposed to semiconductor substrate 101, and a peripheral portion of the infrared cut filter layer 311.

(d) Reversal

Subsequently, as shown in step (d) in FIG. 11, the top and the bottom of the sensor component 100 and the infrared cut filter 300 stuck together are reversed.

The reversal is performed such that a surface on the opposite side of a surface of the sensor component 100 opposed to the infrared cut filter 300 faces upward. The sensor component 100 and the infrared cut filter 300 stuck together are supported by the manufacturing apparatus on a surface on the opposite side of a surface of the infrared cut filter 300 on which the infrared cut filter layer 311 is provided. In other words, the sensor component 100 and the infrared cut filter 300 stuck together are supported on the lower surface of the glass wafer 301W.

(e) Formation of Bumps 402

Subsequently, as shown in step (e) in FIG. 11, bumps 402 are formed.

The bumps 402 are formed on the surface on the opposite side of the surface of the sensor component 100 opposed to the infrared cut filter 300. In other words, the bumps 402 are formed on a surface opposite to a surface of the semiconductor wafer 101W opposed to the glass wafer 301W.

Specifically, prior to the formation of the bumps 402, via holes VH are formed in the semiconductor substrate 101 included in the sensor component 100 to expose the surfaces of pad electrodes PAD. After the insulating layer 400 and the conductive layer 401 are provided, the bumps 402 are formed using a metal material (see FIG. 5).

(f) Dicing

Subsequently, as shown in step (f) in FIG. 11, dicing is applied to the sensor component 100 and the infrared cut filter 300 to divide the sensor component 100 and the infrared cut filter 300 into the plural solid-state imaging devices 1.

The dicing is carried out in scribe areas among the plural solid-state imaging devices 1 to divide a wafer-like object in which the plural solid-state imaging devices 1 are provided into each of the solid-state imaging devices 1. The dicing is carried out for the glass wafer 301W and the semiconductor wafer 101W stuck together to divide into the plural solid-state imaging devices 1.

In this way, the solid-state imaging device 1 is completed by performing the dicing to divide the semiconductor wafer 101W into plural semiconductor substrates 101 and divide the glass wafer 301W into plural glass substrates 301.

(3) Conclusion

As explained above, in the solid-state imaging device in this embodiment, in the infrared cut filter 300, the infrared cut filter layer 311 is formed on the glass substrate 301. The sensor component 100 is arranged to be opposed to the infrared cut filter 300. The plural pixels that receive light made incident via the infrared cut filter layer 311 are arrayed in the pixel area PA of the semiconductor substrate 101. The bonding layer 501 is provided between the infrared cut filter 300 and the sensor component 100 to stick the infrared cut filter 300 and the sensor component 100 together.

The infrared cut filter layer 311 is the dielectric multilayer film in which the plural dielectric layers having a high refractive index and the plural dielectric layers having a low refractive index are alternately stacked. The infrared cut filter layer 311 is formed to cover the portion corresponding to the pixel area PA and a part of the surrounding area SA located around the pixel area PA on the surface of the glass substrate 301 on the side opposed to the sensor component 100. The bonding layer 501 is in contact with, in the peripheral portion of the surfaces of the sensor component 100 and the infrared cut filter 300 opposed to each other, the portion not covered with the infrared cut filter layer 311 on the glass substrate 301 and the peripheral portion of the infrared cut filter layer 311.

Figure 14:
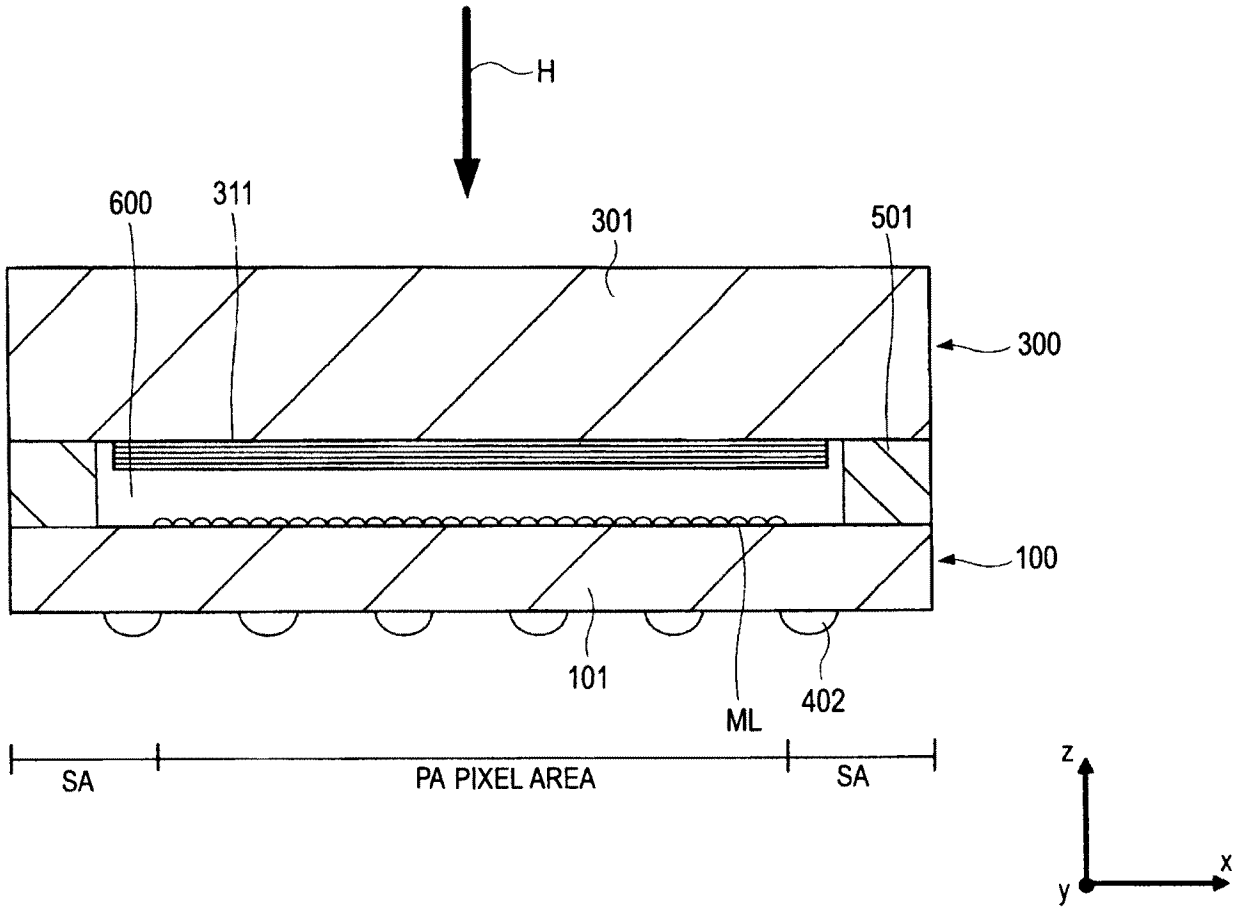
FIG. 14 is a diagram of a solid-state imaging device in a comparative example of the first embodiment of the present disclosure.

FIG. 14 is a diagram of a solid-state imaging device in a comparative example of the first embodiment of the present disclosure. Like FIG. 3, FIG. 14 is a sectional view and schematically shows the configuration of the solid-state imaging device.

As shown in FIG. 14, in the comparative example, as in the first embodiment, the infrared cut filter layer 311 of the infrared cut filter 300 is provided in the center portion of the glass substrate 301. The bonding layer 501 is provided in contact with the peripheral portion not covered with the infrared cut filter layer 311 on the glass substrate 301. However, unlike the bonding layer 501 in the first embodiment, the bonding layer 501 is not provided in contact with the peripheral portion of the infrared cut filter layer 311. In other words, the bonding layer 501 is not provided in contact with the side end face of the infrared cut filter layer 311 and the side end of the surface of the infrared cut filter layer 311 opposed to the sensor component 100.

Therefore, in the comparative example, the infrared cut filter layer 311 is not fixed to the glass substrate 301 by the bonding layer 501. Therefore, the infrared cut filter layer 311 could peel from the glass substrate 301. The image quality of a picked-up image could be deteriorated by the peeled infrared cut filter layer 311. In particular, when a pixel size is refined (e.g., 1.4 μm square), the influence of the image quality deterioration is serious and the deficiencies explained above tend to occur.

On the other hand, in this embodiment, as shown in FIG. 3, the bonding layer 501 is provided in contact with the peripheral portion of the infrared cut filter layer 311 and fixes the infrared cut filter layer 311 to the glass substrate 301.

Therefore, in this embodiment, it is possible to suitably prevent the infrared cut filter layer 311 from peeling from the glass substrate 301.

Besides, since the side end of the infrared cut filter layer 311 is not in an exposed state, the infrared cut filter layer 311 is less easily affected by moisture included in the outdoor air. Therefore, it is possible to suitably prevent the peeling.

In this embodiment, in the step of forming the infrared cut filter 300, the infrared cut filter layer 311 is formed on the glass substrate 301 by the lift-off method. Therefore, in this embodiment, as shown in step (a2) in FIG. 12, the infrared cut filter layer 311 is discontinuously formed on the surface of the glass wafer 301W and does not continuously cover the entire surface of the glass wafer 301W. Therefore, it is possible to suppress occurrence of a warp in the glass substrate 301.

In this embodiment, the infrared cut filter layer 311 is formed on the side of the glass substrate 301 opposed to the semiconductor substrate 101. Therefore, the surface of the glass substrate 301 on which the infrared cut filter layer 311 is not formed is exposed and the surface of the glass substrate 301 on which the infrared cut filter layer 311 is formed is not exposed. Therefore, it is possible to prevent scratches from occurring on the infrared cut filter layer 311 because of handling in a manufacturing process.

Further, in this embodiment, in the step of forming the infrared cut filter 300, the notch pattern same as the notch shape (not shown) formed on the semiconductor substrate 101 is formed on the glass substrate 301 simultaneously with the formation of the infrared cut filter layer 311. In the sticking step, the semiconductor substrate 101 and the glass substrate 301 are aligned using the notch shape of the semiconductor substrate 101 and the notch pattern of the glass substrate 301.

Therefore, in this embodiment, it is possible to easily realize improvement of manufacturing efficiency, a reduction in cost, improvement of reliability, and a reduction in size.

2. Second Embodiment

(1) Apparatus Configuration, Etc.

Figure 15:
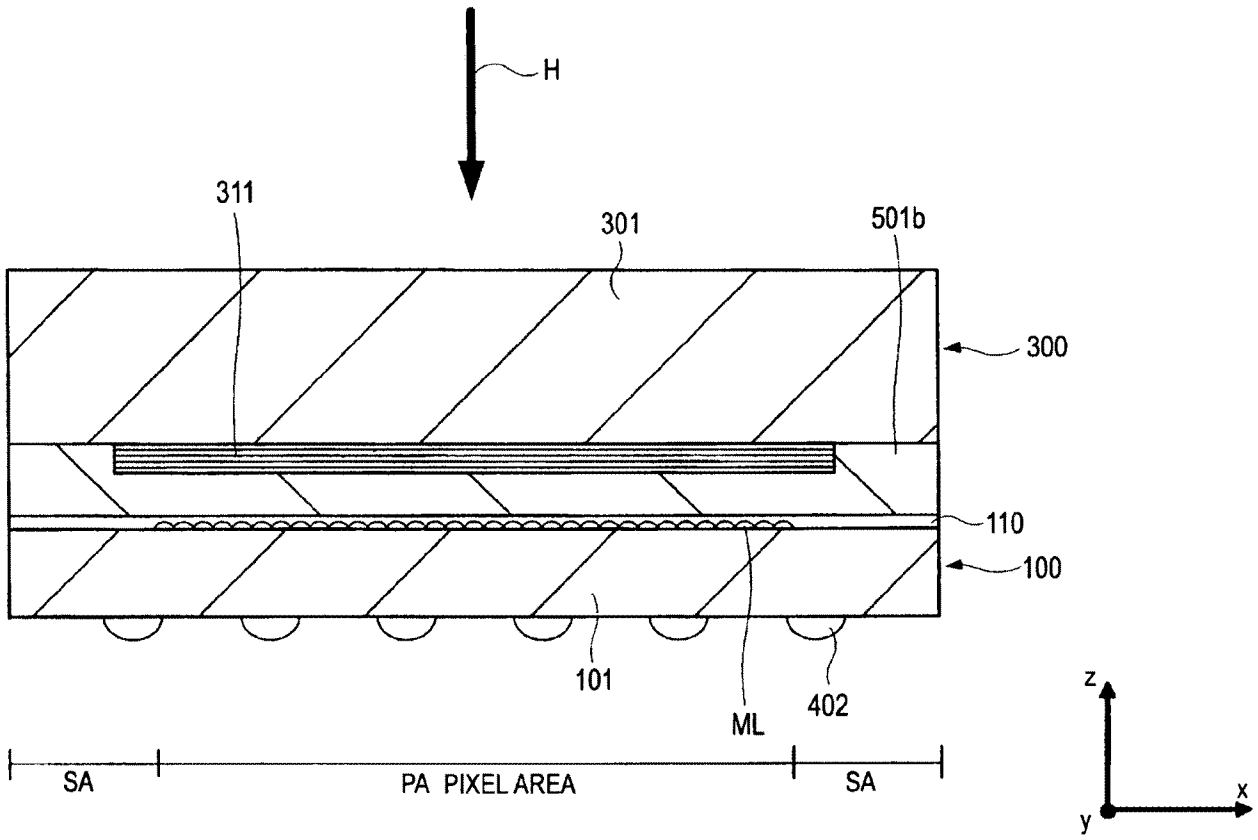
FIG. 15 is a diagram of a main part of a solid-state imaging device in a second embodiment of the present disclosure.

FIG. 15 is a diagram of a main part of a solid-state imaging device in a second embodiment of the present disclosure. Like FIG. 3, FIG. 15 shows a sectional view of the solid-state imaging device.

As shown in FIG. 15, this embodiment is different from the first embodiment in the configuration of a bonding layer 501b. This embodiment is same as the first embodiment except this difference and points related to this difference. Therefore, description is omitted as appropriate to avoid redundancy.

As shown in FIG. 15, as in the first embodiment, the bonding layer 501b is provided between the sensor component 100 and the infrared cut filter 300.

However, in this embodiment, unlike the bonding layer 501 in the first embodiment, the cavity section 600 (see FIG.

3) is not provided in the center portion of the surfaces of the sensor component 100 and the infrared cut filter 300 opposed to each other. In this embodiment, a low-refractive index layer 110 is provided to cover the micro lenses ML. The low-refractive index layer 110 is formed such that the thickness of a flat portion covering the micro lenses ML is, for example, about 0.3 μm to 5 μm.

The sensor component 100 is stuck with the infrared cut filter 300 by the bonding layer 501b on the upper surface of the low-refractive index layer 110. The bonding layer 501b is provided over the entire surfaces of the sensor component 100 and the infrared cut filter 300 opposed to each other. The sensor component 100 and the infrared cut filter 300 are stuck together by the bonding layer 501b. In other words, besides the peripheral portion of the surfaces of the sensor component 100 and the infrared cut filter 300 opposed to each other, the bonding layer 501b is provided in the center portion of the surfaces.

Specifically, the bonding layer 501b is provided in contact with both the surface of the glass substrate 301 of the infrared cut filter 300 not covered with the infrared cut filter layer 311 and the surface of the infrared cut filter layer 311 opposed to the sensor component 100.

For example, a siloxane, epoxy, or acrylic adhesive is suitably used for the bonding layer 501b. In particular, the siloxane adhesive is suitable because the siloxane adhesive is excellent in heat resistance and chemical resistance in a manufacturing process and excellent in transparency and light resistance when used in the solid-state imaging device.

In this embodiment, the cavity section 600 (see FIG. 3) is not provided. In the portion where the cavity section 600 is provided in the first embodiment, the bonding layer 501b having a refractive index (e.g., n=1.4 to 1.6) higher than that of the air is provided. Therefore, concerning the micro lenses ML, it is suitable to improve light condensing performance using a material having a refractive index higher than that of the bonding layer 501b. For example, it is suitable to form the micro lenses ML using a high-refractive index material such as SiN (n=2.1).

When the cavity section 600 is provided, light condensation occurs according to a lens effect due to a difference between a refractive index (e.g., about 1.6) of the micro lenses ML and a refractive index (1) of the air. However, when the entire cavity section 600 is filled with an adhesive, since a refractive index difference between a refractive index (about 1.5) of the adhesive and the refractive index (e.g., about 1.6) of the micro lenses ML is small, the light condensing efficiency falls. Therefore, the micro lenses ML are formed using a material having a high refractive index (e.g., 1.8 to 2.2) and the low-refractive index layer 110 is formed using a material having a low refractive index (e.g., 1.33 to 1.45). Consequently, the refractive index difference increases to about 0.6 and the light condensing efficiency can be improved.

(2) Conclusion

As explained above, as in the first embodiment, the infrared cut filter layer 311 in this embodiment is formed to cover the portion corresponding to the pixel area PA and a part of the surrounding area SA on the surface of the glass substrate 301 on the side opposed to the sensor component 100. The bonding layer 501b is at least in contact with, in the peripheral portion of the surfaces of the sensor component 100 and the infrared cut filter 300 opposed to each other, the portion of the glass substrate 301 not covered with the infrared cut filter layer 311 and the peripheral portion of the infrared cut filter layer 311.

In this embodiment, unlike the bonding layer 501 in the first embodiment, the bonding layer 501b is provided over the entire surfaces of the infrared cut filter 300 and the sensor component 100 opposed to each other. In other words, the solid-state imaging device has a cavity-less structure.

Therefore, in this embodiment, it is possible to more suitably prevent occurrence of peeling. In particular, it is possible to suitably prevent occurrence of peeling due to a heat cycle.

3. Third Embodiment

(1) Manufacturing Method, Etc.

Figure 16:
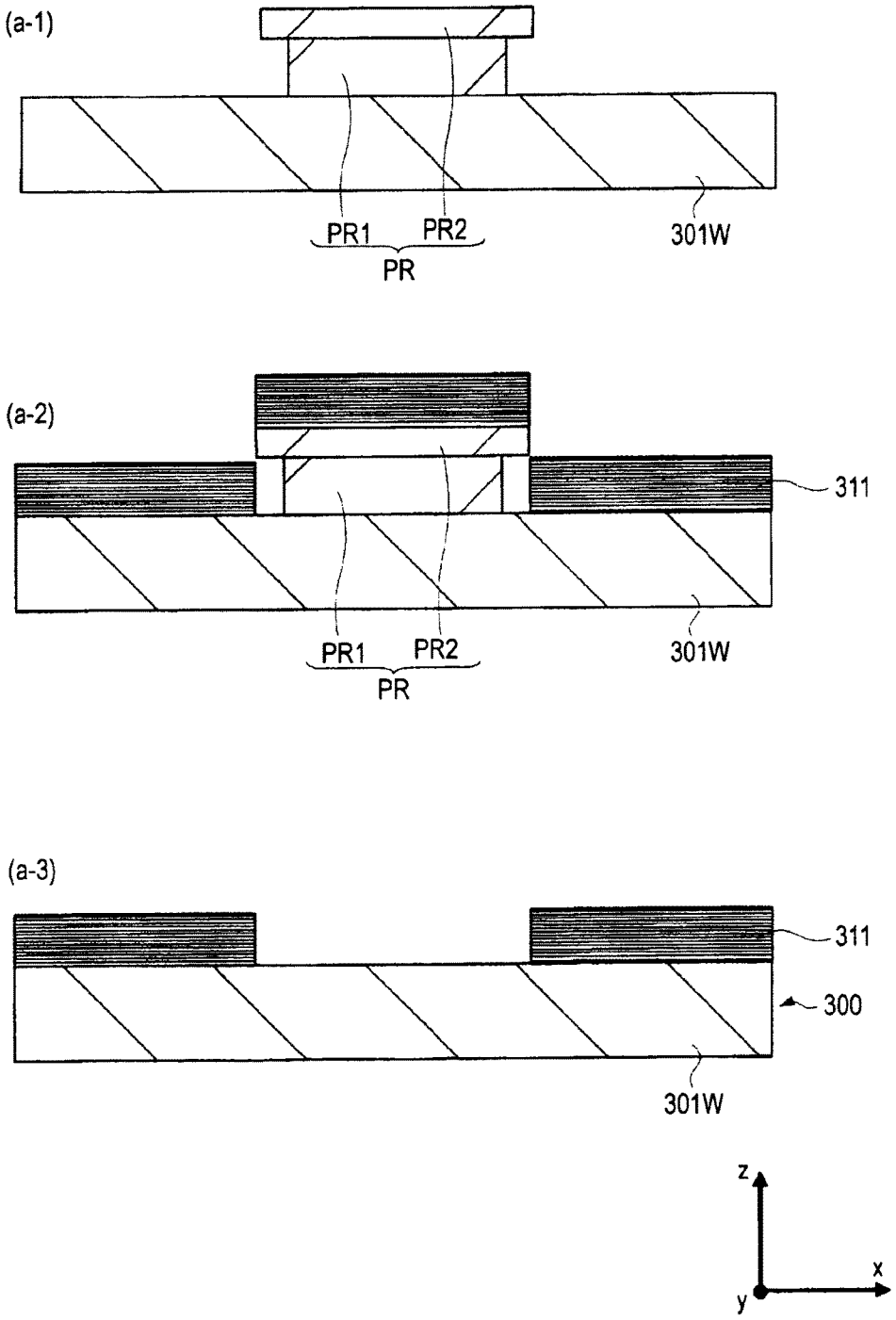
FIG. 16 is a diagram for explaining a method of manufacturing the infrared cut filter in a third embodiment of the present disclosure.

FIG. 16 is a diagram for explaining a manufacturing method for forming the infrared cut filter 300 in a third embodiment of the present disclosure. Like FIG. 12, FIG. 16 shows a cross section of the infrared cut filter 300.

As shown in FIG. 16, this embodiment is different from the first embodiment in the manufacturing method for forming the infrared cut filter 300. This embodiment is same as the first embodiment except this difference and points related to this difference. Therefore, description is omitted as appropriate to avoid redundancy.

In this embodiment, as shown in FIG. 16, the infrared cut filter layer 311 is formed on the glass wafer 301W through steps (a1) to (a3). In this embodiment, as in the first and second embodiments, the infrared cut filter layer 311 is formed by the lift-off method.

In the formation of the infrared cut filter 300, first, as shown in step (a1) in FIG. 16, the photoresist pattern PR is provided.

The photoresist pattern PR is formed to be located above an area other than an area where the infrared cut filter layer 311 is formed on the upper surface of the glass wafer 301W.

In this embodiment, the photoresist pattern PR is provided by stacking, in order, a first photoresist pattern PR1 and a second photoresist pattern PR2 wider than the first photoresist pattern PR1.

For example, the first photoresist pattern PR1 is suitably formed to have width smaller than the width of the second photoresist pattern PR2 by about 0.5 μm to 5 μm. The first photoresist pattern PR1 is suitably thicker than a dielectric multilayer film including thirty to sixty layers formed as the infrared cut filter layer 311. Each of the layers of the dielectric multilayer film needs to have thickness of ¼λ. Therefore, when averaged, the thickness of each of the layers is 150 nm (600 nm/4). Therefore, the thickness of the dielectric multilayer film is 4.5 μm to 9 μm. Therefore, the combined thickness of the first photoresist pattern PR1 and the second photoresist pattern PR2 is suitably larger than this thickness by about 2 μm.

Subsequently, as shown in step (a2) in FIG. 16, the infrared cut filter layer 311 is formed.

In this embodiment, as in the first embodiment, the infrared cut filter layer 311 is formed to cover the upper surface of the glass wafer 301W on which the photoresist pattern PR is formed. Consequently, the infrared cut filter layer 311 is formed on the upper surface of the photoresist pattern PR as well as on the upper surface of the glass wafer 301W.

Subsequently, as shown in step (a3) in FIG. 16, the photoresist pattern PR is removed.

The photoresist pattern PR, on the upper surface of which the infrared cut filter layer 311 is formed as explained above, is removed. Consequently, the infrared cut filter layer 311 is formed in a desired pattern on the upper surface of the glass wafer 301W.

(2) Conclusion

As explained above, in this embodiment, the solid-state imaging device is configured the same as the solid-state imaging device in the first embodiment.

Therefore, in this embodiment, as in the first embodiment, it is possible to easily realize improvement of manufacturing efficiency, a reduction in cost, improvement of reliability, and a reduction in size.

4. Fourth Embodiment (1) Apparatus Configuration, Etc.

Figure 17:
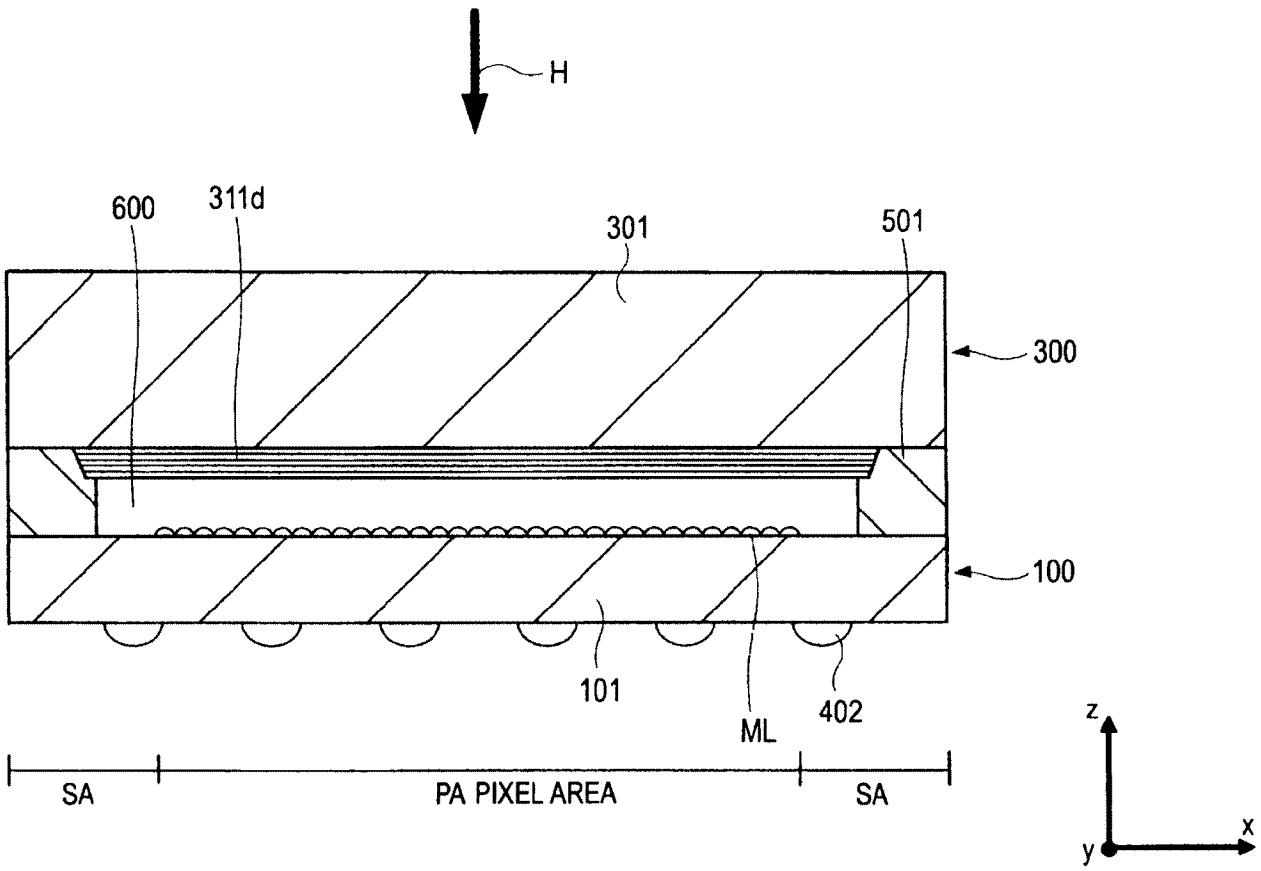
FIG. 17 is a diagram of a main part of a solid-state imaging device in a fourth embodiment of the present disclosure.

FIG. 17 is a diagram of a main part of a solid-state imaging device in a fourth embodiment of the present disclosure. Like FIG. 3, FIG. 17 shows a cross section of the solid-state imaging device.

As shown in FIG. 17, this embodiment is different from the first embodiment in the configuration of an infrared cut filter layer 311d. This embodiment is same as the first embodiment except this difference and points related to this difference. Therefore, description is omitted as appropriate to avoid redundancy.

As shown in FIG. 17, as in the first embodiment, the infrared cut filter layer 311d is provided on a surface of the glass substrate 301 opposed to the sensor component 100.

As shown in FIG. 17, unlike the infrared cut filter 311 in the first embodiment (FIG. 3), the infrared cut filter layer 311d is provided such that a cross section thereof is formed in a taper shape.

Specifically, a side end face of the infrared cut filter layer 311d inclines to be reduced in width from the side of the glass substrate 301 toward the side of the sensor component 100.

The bonding layer 501 is provided to cover the inclining side end face of the infrared cut filter layer 311d.

FIG. 18 is a diagram for explaining a manufacturing method for forming the infrared cut filter 300 in the fourth embodiment of the present disclosure. Like FIG. 12, FIG. 18 shows a cross section of the infrared cut filter 300.

In this embodiment, as shown in FIG. 18, the infrared cut filter layer 311d is formed on the glass wafer 301W through steps (a1) to (a3).

First, as shown in step (a1) in FIG. 18, the infrared cut filter layer 311d is formed.

The infrared cut filter layer 311d is formed under conditions same as those in the first embodiment to cover the entire upper surface of the glass wafer 301W.

Subsequently, as shown in step (a2) in FIG. 18, the infrared cut filter layer 311d is patterned.

A photoresist pattern PRd is formed on the upper surface of the infrared cut filter layer 311d formed over the entire upper surface of the glass wafer 301W. Isotropic etching is carried out for the infrared cut filter layer 311d using the photoresist pattern PRd as a mask. Consequently, the infrared cut filter layer 311d is patterned such that a cross section thereof is formed in a taper shape.

For example, the infrared cut filter layer 311d is formed such that an angle of inclination of the taper shape is an angle close to 45°. Besides, when the patterning is performed by dry etching, the infrared cut filter layer 311d is formed such that the side thereof is vertical.

Subsequently, as shown in step (a3) in FIG. 18, the photoresist pattern PRd is removed.

The photoresist pattern PRd formed on the upper surface of the infrared cut filter layer 311d as explained above is removed. Consequently, the infrared cut filter layer 311d is formed in a desired pattern on the upper surface of the glass wafer 301W.

(2) Conclusion

As explained above, as in the first embodiment, the infrared cut filter layer 311d in this embodiment is formed to cover the portion corresponding to the pixel area PA and a part of the surrounding area SA on the surface of the glass substrate 301 on the side opposed to the sensor component 100. The bonding layer 501 is in contact with, in the peripheral portion of the surfaces of the sensor component 100 and the infrared cut filter 300 opposed to each other, the portion of the glass substrate 301 not covered with the infrared cut filter layer 311d and the peripheral portion of the infrared cut filter layer 311d.

In this embodiment, unlike the infrared cut filter layer 311 in the first embodiment, the side end face of the infrared cut filter layer 311d inclines to be reduced in width from the side of the glass substrate 301 toward the side of the sensor component 100. The bonding layer 501 is provided to cover the inclining side end face of the infrared cut filter layer 311d.

Therefore, in this embodiment, it is possible to more suitably prevent occurrence of peeling.

5. Fifth Embodiment (1) Apparatus Configuration, Etc.

Figure 19:
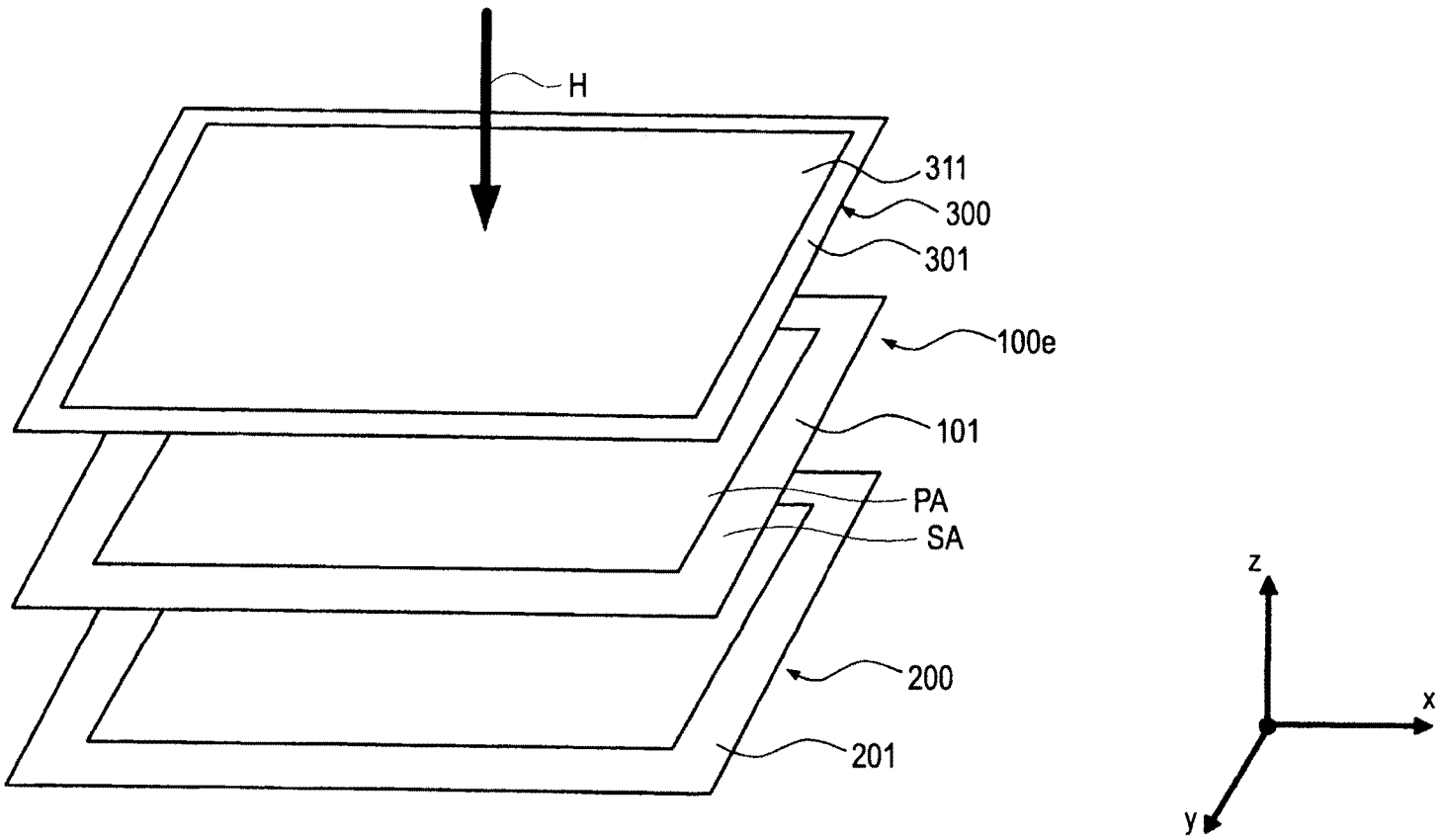
FIG. 19 is a diagram of a main part of a solid-state imaging device in a fifth embodiment of the present disclosure.
Figure 20:
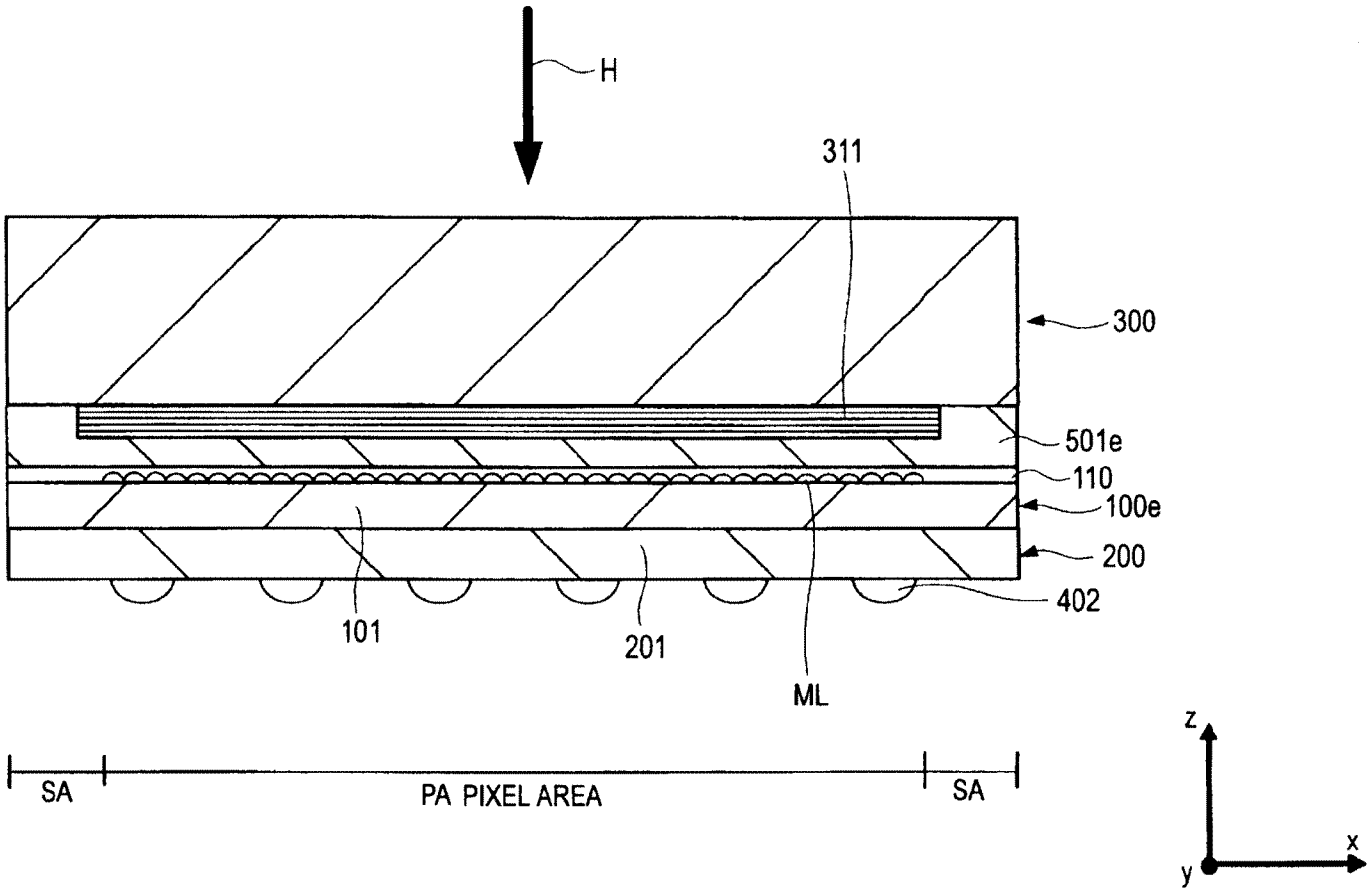
FIG. 20 is a diagram of a main part of the solid-state imaging device in the fifth embodiment of the present disclosure.
Figure 21:
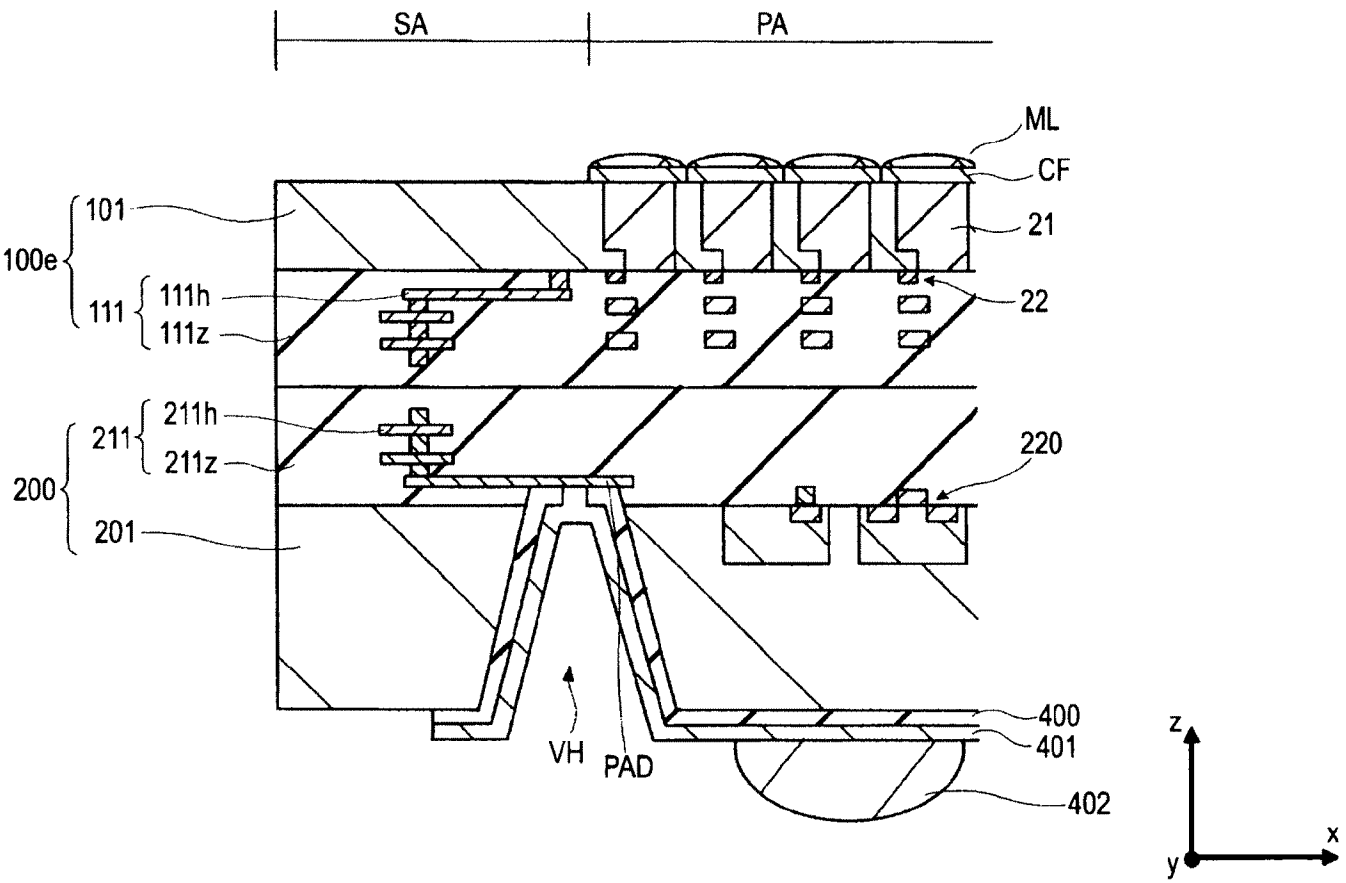
FIG. 21 is a diagram of a main part of the solid-state imaging device in the fifth embodiment of the present disclosure.

FIGS. 19, 20, and 21 are diagrams of a main part of a solid-state imaging device in a fifth embodiment of the present disclosure.

Like FIG. 2, FIG. 19 is a perspective view. Like FIG. 3, FIG. 20 is a sectional view. FIGS. 19 and 20 schematically show the configuration of the solid-state imaging device. Like FIG. 5, FIG. 21 shows a part of a cross section of the solid-state imaging device.

As shown in FIGS. 19, 20, and 21, unlike the solid-state imaging device in the first embodiment, the solid-state imaging device in this embodiment includes a logic circuit component 200. As shown in FIG. 21, this embodiment is different from the first embodiment in a form of a sensor component 100e. This embodiment is also different from the first embodiment in the configuration of a bonding layer 501e. This embodiment is same as the first embodiment except this difference and points related to this difference. Therefore, description is omitted as appropriate to avoid redundancy.

As shown in FIGS. 19 and 20, as in the first embodiment, the sensor component 100e and the infrared cut filter 300 are arranged to be opposed to each other.

As shown in FIG. 20, unlike the solid-state imaging device in the first embodiment, the hollow cavity section 600 (see FIG. 3) is not provided in the center portion of the surfaces of the sensor component 100e and the infrared cut filter 300 opposed to each other. As in the second embodiment, the low-refractive index layer 110 is provided to cover the micro lenses ML. The bonding layer 501e is provided over the entire surfaces of the sensor component 100e and the infrared cut filter 300 opposed to each other. The sensor component 100e and the infrared cut filter 300 are stuck together by the bonding layer 501e. Unlike the bonding layer 501 in the first embodiment, the bonding layer 501e is provided over the entire surfaces of the infrared cut filter 300 and the sensor component 100e opposed to each other. In other words, as in the second embodiment, the solid-state imaging device has a cavity-less structure.

In the sensor component 100e, as shown in FIGS. 19 and 20, as in the first embodiment, the pixel area PA and the surrounding area SA located around the pixel area PA are provided. As in the first embodiment, the pixel area PA is formed in a rectangular shape. Plural pixels (not shown) are arranged in each of the horizontal direction x and the vertical direction y. However, in the surrounding area SA, unlike the solid-state imaging device in the first embodiment, a part or all of the peripheral circuits are not provided. In this embodiment, a part or all of the peripheral circuits not provided in the surrounding area SA of the sensor component 100e are provided in the logic circuit component 200. In the surrounding area SA of the sensor component 100e, the vertical driving circuit 13 and the timing generator 18 shown in FIG. 4 are provided. In the logic circuit component 200, for example, the column circuit 14, the horizontal driving circuit 15, and the external output circuit 17 shown in FIG. 4 are provided.

As shown in FIG. 21, in the sensor component 100e, the wiring layer 111 is provided on the front surface (the lower surface) of the semiconductor substrate 101. In the sensor component 100e, in the pixel area PA, the photodiode 21 is provided on the inside of the semiconductor substrate 101. Unlike the solid-state imaging device in the first embodiment, in the pixel area PA, the color filter CF and the micro lenses ML are provided in order on the rear surface (the upper surface) of the semiconductor substrate 101. The photodiode 21 receives the incident light H made incident from the rear surface side of the semiconductor substrate 101 via the micro lenses ML, the color filter CF, and the wiring layer 111. In other words, the solid-state imaging device in this embodiment is an image sensor chip of a "back-illuminated type".

As shown in FIGS. 19 and 20, the logic circuit component 200 is arranged on the side of a surface of the sensor component 100e opposite to a surface on which the infrared cut filter 300 is arranged. The logic circuit component 200 is electrically connected to the sensor component 100e.

As shown in FIG. 21, the logic circuit component 200 includes a semiconductor substrate 201. For example, the semiconductor substrate 201 is formed of a monocrystal silicon and arranged to be opposed to the sensor component 100e.

In the logic circuit component 200, a semiconductor component 220 is provided on a surface of the semiconductor substrate 201 on the side of the sensor component 100e. The semiconductor component 220 is, for example, a MOS transistor. Although not shown in the fig., plural semiconductor components 220 are provided to form the peripheral circuits shown in FIG. 4. The wiring layer 211 is provided to cover the front surface (the upper surface) of the semiconductor substrate 201. The wiring layer 211 is a multilayer wiring layer and includes plural wires 211h and insulating layers 211z. The wiring layer 211 is formed by alternately stacking the wires 211h and insulating films. The wires 211h are provided to be covered with the insulating layers 211z. The pad electrode PAD is provided in the wiring layer 211.

In the logic circuit component 200, as shown in FIG. 21, the insulating layer 400 and the conductive layer 401 are provided in order on the rear surface (the lower surface) of the semiconductor substrate 101. The bump 402 is provided on the lower surface of the conductive layer 401.

In the logic circuit component 200, as shown in FIG. 21, the via hole VH piercing through the semiconductor substrate 201 is provided. In other words, a through silicon via is provided. The via hole VH is formed to expose the lower surface of the pad electrode PAD provided in the wiring layer 211. The conductive layer 401 is coated on the inside of the via hole VH via the insulating layer 400. An opening is formed in the insulating layer 400 to expose a part of the lower surface of the pad electrode PAD. The conductive layer 401 is formed to bury the opening of the insulating layer 400 and electrically connected to the pad electrode PAD.

As shown in FIG. 20, the sensor component 100e and the logic circuit component 200 are joined. As shown in FIG. 21, the wiring layer 111 of the sensor component 100e and the wiring layer 211 of the logic circuit component 200 are joined. The wiring layers 111 and 211 are electrically connected by a wire.

(2) Conclusion

As explained above, as in the first embodiment, the infrared cut filter layer 311 in this embodiment is formed to cover the portion corresponding to the pixel area PA and a part of the surrounding area SA on the surface of the glass substrate 301 on the side opposed to the sensor component 100e. The bonding layer 501e is at least in contact with, in the peripheral portion of the surfaces of the sensor component 100e and the infrared cut filter 300 opposed to each other, the portion not covered with the infrared cut filter layer 311 on the glass substrate 301 and the peripheral portion of the infrared cut filter layer 311.

Therefore, in this embodiment, as in the first embodiment, it is possible to easily realize improvement of manufacturing efficiency, a reduction in cost, improvement of reliability, and a reduction in size.

In this embodiment, a part of the peripheral circuits is provided in the surrounding area SA of the sensor component 100e. However, the configuration of the solid-state imaging device is not limited to this. The solid-state imaging device may be configured to provide all the peripheral circuits shown in FIG. 4 in the logic circuit component 200 without providing the peripheral circuits in the surrounding area SA of the sensor component 100e. Besides, a wiring board may be provided instead of the logic circuit component 200. In other words, the solid-state imaging device may be configured by stacking plural semiconductor chips having different functions.

6. Others

In carrying out the present disclosure, the present disclosure is not limited to the embodiments explained above and various modifications can be adopted.

In the embodiments, when the semiconductor device is the solid-state imaging device, the solid-state imaging device is applied to the camera. However, the solid-state imaging device is not limited to this. The solid-state imaging device may be applied to other electronic apparatuses including the solid-state imaging device such as a scanner and a copying machine.

In the embodiments, two or three semiconductor chips are stacked. However, the present disclosure is not limited to this. The present disclosure may be applied when four or more semiconductor chips are stacked.

Besides, the embodiments may be combined as appropriate.

In the embodiments, the solid-state imaging device 1 is equivalent to the solid-state imaging device according to the present disclosure. In the embodiments, the camera 40 is equivalent to the electronic apparatus according to the present disclosure. In the embodiments, the sensor components 100 and 100e are equivalent to the solid-state imaging component according to the present disclosure. In the embodiments, the semiconductor substrate 101 and the semiconductor wafer 101W are equivalent to the semiconductor substrate according to the present disclosure. In the embodiments, the infrared cut filter 300 is equivalent to the optical filter according to the present disclosure. In the embodiments, the glass substrate 301 and the glass wafer 301W are equivalent to the transparent substrate according to the present disclosure. In the embodiments, the infrared cut filter layers 311 and 311d are equivalent to the filter layer according to the present disclosure. In the embodiments, the bonding layers 501, 501b, and 501e are equivalent to the bonding layer according to the present disclosure. In the embodiments, the cavity section 600 is equivalent to the cavity section according to the present disclosure. In the embodiments, the pixels P are equivalent to the pixels according to the present disclosure. In the embodiments, the pixel area PA is equivalent to the pixel area according to the present disclosure.

The present disclosure contains subject matter related to those disclosed in Japanese Priority Patent Applications JP 2011-029963 and JP 2011-029966 both filed in the Japan Patent Office on Feb. 15, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

[1. A solid-state imaging device comprising:

an optical filter in which a filter layer is formed on a transparent substrate;

a solid-state imaging component that is arranged to be opposed to the optical filter and in which plural pixels that receive light made incident via the filter layer are arrayed in a pixel area of a semiconductor substrate; and a bonding layer that is provided between the optical filter and the solid-state imaging component and sticks the optical filter and the solid-state imaging component together, wherein the filter layer is a dielectric multilayer film in which plural dielectric layers having a high refractive index and plural dielectric layers having a low refractive index are alternately stacked and is formed to cover a portion corresponding to the pixel area and a part of an area located around the pixel area on a surface of the transparent substrate on a side opposed to the solid-state imaging component, and the bonding layer is provided to be at least in contact with, in a peripheral portion of surfaces of the solid-state imaging component and the optical filter opposed to each other, a portion not covered by the filter layer and a peripheral portion of the filter layer on the transparent substrate.]

[2. The solid-state imaging device according to claim 1, wherein a cavity section is provided between the optical filter and the solid-state imaging component opposed to each other, in the solid-state imaging component, the pixel area is provided such that the pixels receive light made incident via the cavity section, and the bonding layer is provided to surround a periphery of the cavity section between the optical filter and the solid-state imaging component opposed to each other.]

[3. The solid-state imaging device according to claim 1, wherein the bonding layer is provided over the surfaces of the optical filter and the solid-state imaging component opposed to each other.]

[4. The solid-state imaging device according to claim 2, wherein a side end face of the filter layer inclines to be reduced in width from a side of the transparent substrate toward a side of the solid-state imaging component, and the bonding layer is provided to cover a tilting side end face of the filter layer.]

[5. A method of manufacturing a solid-state imaging device, comprising the steps of:

forming an optical filter by forming a filter layer on a transparent substrate;

forming a solid-state imaging component by providing, in a pixel area of a semiconductor substrate, plural pixels which receive light; and sticking the optical filter and the solid-state imaging component together by providing a bonding layer between the optical filter and the solid-state imaging component opposed to each other such that the pixels receive light made incident via the filter layer, wherein in the step of forming an optical filter, the filter layer is formed by providing, to cover a portion corresponding to the pixel area and a part of an area located around the pixel area on a surface of the transparent substrate on a side opposed to the solid-state imaging component, a dielectric multilayer film in which plural dielectric layers having a high refractive index and plural dielectric layers having a low refractive index are alternately stacked, and in the step of sticking the optical filter and the solid-state imaging component together, the optical filter and the solid-state imaging component are stuck together by providing the bonding layer to be at least in contact with, in a peripheral portion of a surface opposed to the semiconductor substrate on the transparent substrate, a portion not covered by the filter layer and a peripheral portion of the filter layer.]

[6. The method of manufacturing a solid-state imaging device according to claim 5, wherein in the step of forming an optical filter, a plurality of the optical filters are formed on the transparent substrate, in the step of forming a solid-state imaging component, a plurality of the solid-state imaging components are formed on the semiconductor substrate, in the step of sticking the optical filter and the solid-state imaging component together, the transparent substrate and the semiconductor substrate are aligned and stuck together such that each of the plural optical filters and each of the plural solid-state imaging components correspond to each other, and dicing is carried out for the transparent substrate and the semiconductor substrate stuck together to divide transparent substrate and the semiconductor substrate into plural solid-state imaging devices.]

[7. The method of manufacturing a solid-state imaging device according to claim 6, wherein, in the step of forming an optical filter, the filter layer is formed on the transparent substrate by a lift-off method.]

[8. The method of manufacturing a solid-state imaging device according to claim 7, wherein the step of forming an optical filter includes the steps of:

forming a photoresist pattern to be located above an area other than an area where the filter layer is formed on a surface of the transparent substrate;

forming, to cover an upper surface of the transparent substrate and an upper surface of the photoresist pattern, a filter layer on the surface of the transparent substrate on which the photoresist pattern is formed; and removing the photoresist pattern, the upper surface of which is covered with the filter layer, and in the step of forming a photoresist pattern, the photoresist pattern is formed to have a sectional shape having small width on a side close to the transparent substrate and gradually having larger width farther away from the transparent substrate.]

[9. The method of manufacturing a solid-state imaging device according to claim 7, wherein in the step of forming an optical filter, a notch pattern same as a notch shape formed on the semiconductor substrate is formed on the transparent substrate simultaneously with the formation of the filter layer, and in the step of sticking the optical filter and the solid-state imaging component together, the semiconductor substrate and the transparent substrate are aligned using the notch shape of the semiconductor substrate and the notch pattern of the transparent substrate.]

[10. An electronic apparatus comprising:

an optical filter in which a filter layer is formed on a transparent substrate;

a solid-state imaging component that is arranged to be opposed to the optical filter and in which plural pixels that receive light made incident via the filter layer are arrayed in a pixel area of a semiconductor substrate; and a bonding layer that is provided between the optical filter and the solid-state imaging component and sticks the optical filter and the solid-state imaging component together, wherein the filter layer is a dielectric multilayer film in which plural dielectric layers having a high refractive index and plural dielectric layers having a low refractive index are alternately stacked and is formed to cover a portion corresponding to the pixel area and a part of an area located around the pixel area on a surface of the transparent substrate on a side opposed to the solid-state imaging component, and the bonding layer is provided to be at least in contact with, in a peripheral portion of surfaces of the solid-state imaging component and the optical filter opposed to each other, a portion not covered by the filter layer and a peripheral portion of the filter layer on the transparent substrate.]

*11. An imaging device comprising:*

*an optical filter in which a filter layer is formed on a transparent substrate of the optical filter;*

*a solid-state imaging component that is arranged to be opposed to the optical filter and in which plural pixels that receive light made incident via the filter layer are arrayed in a pixel area of a semiconductor substrate; and*

*a bonding layer that is provided between the optical filter and the solid-state imaging component and sticks the optical filter and the solid-state imaging component together, wherein*

*the filter layer is a dielectric multilayer film in which plural dielectric layers having a high refractive index and plural dielectric layers having a low refractive index are alternately stacked and is formed to cover a portion corresponding to the pixel area and a part of a first area located outside of the pixel area on a surface of the transparent substrate on a side opposed to the solid-state imaging component,*

*the bonding layer is provided to be at least in contact with the transparent substrate of the optical filter and the filter layer of the optical filter,*

*the solid-state imaging component includes a wiring layer provided on the semiconductor substrate,*

*the wiring layer includes a pad electrode in a portion corresponding to the first area,*

*the pad electrode is electrically connected to a bump, the bump being provided, via a conductive layer, on a side of the solid-state imaging component opposite to an incident side of the light,*

*an insulating layer is provided between the semiconductor substrate and the conductive layer, and*

*a side end face of the filter layer inclines to be reduced in width from a side of the transparent substrate toward a side of the solid-state imaging component.*

*12. The imaging device according to claim 11, wherein*

*the bonding layer sticks the optical filter and the solid-state imaging component together in non-directly-touching fashion.*

*13. The imaging device according to claim 11, wherein*

*the bonding layer is provided to be in direct contact with the solid-state imaging component.*

*14. The imaging device according to claim 11, wherein*

*the bonding layer is provided not to be in direct contact with the solid-state imaging component.*

*15. The imaging device according to claim 14, wherein*

*the bonding layer is provided to be in contact with the solid-state imaging component via a low-refractive index layer provided on the solid-state imaging component.*

*16. The imaging device according to claim 11, wherein*

*the bonding layer is provided on a part of a bottom surface of the filter layer facing the solid-state imaging component.*

*17. The imaging device according to claim 16, wherein*

*a cavity section is provided on a remaining part of the bottom surface of the filter layer other than the part of the bottom surface of the filter layer.*

*18. The imaging device according to claim 11, wherein*

*the bonding layer is provided on an entire area of a bottom surface of the filter layer facing the solid-state imaging component.*

*19. The imaging device according to claim 11, further comprising:*

*a low-refractive index layer that is arranged on the solid-state imaging component, wherein*

*the solid-state imaging component is stuck with the optical filter by the bonding layer on an upper surface of the low-refractive index layer.*

*20. The imaging device according to claim 19, further comprising:*

*micro lenses provided in the low-refractive index layer such that the micro lenses are covered by the low-refractive index layer.*

*21. The imaging device according to claim 19, wherein*

*the thickness of the low-refractive index layer is about 0.3 μm to 5 μm.*

*22. The imaging device according to claim 11, wherein*

*the bonding layer is provided over entire surfaces of the solid-state imaging component and the optical filter.*

*23. The imaging device according to claim 11, wherein*

*the bonding layer is provided in a center portion of surfaces of the solid-state imaging component and the optical filter besides a peripheral portion of the surfaces.*

*24. The imaging device according to claim 11, wherein*

*the solid-state imaging component includes a logic circuit component electrically connected to the plural pixels.*

*25. The solid-state imaging device according to claim 11, wherein*

*a via hole is formed to expose a part of the pad electrode in the first area, and*

*the insulating layer is provided between the semiconductor substrate and the conductive layer at least in the via hole.*

*26. The solid-state imaging device according to claim 25, wherein*

*the via hole includes a taper surface.*

*27. The solid-state imaging device according to claim 11, wherein*

*the insulating layer includes an opening at a portion corresponding to the pad electrode, and*

*the conductive layer is electrically connected with the pad electrode via the opening.*

*28. A solid-state imaging device comprising:*

*an optical filter in which a filter layer is formed on a transparent substrate of the optical filter;*

*a solid-state imaging component that is arranged to be opposed to the optical filter and in which plural pixels that receive light made incident via the filter layer are arrayed in a pixel area of a first semiconductor substrate, the solid-state imaging component including a first multilayer wiring layer provided on the first semiconductor substrate, the first multilayer wiring layer including a plurality of wiring layers, the first multilayer wiring layer extending in an in-plane direction parallel to layers of the solid-state imaging device;*

*a logic circuit component stacked on the solid-state imaging component and including a second semiconductor substrate and a second multilayer wiring layer provided on the second semiconductor substrate, the second multilayer wiring layer including a plurality of wiring layers, the second multilayer wiring layer extending in the in-plane direction parallel to the layers of the solid-state imaging device, the first multilayer wiring layer and the second multilayer wiring layer being arranged to face each other,*

*a bonding layer that is provided between the optical filter and the solid-state imaging component and sticks the optical filter and the solid-state imaging component together, wherein*

*the filter layer is a dielectric multilayer film in which plural dielectric layers having a high refractive index and plural dielectric layers having a low refractive index are alternately stacked and is formed to cover a portion corresponding to the pixel area and a part of a first area located outside of the pixel area on a surface of the transparent substrate on a side opposed to the solid-state imaging component,*

*the second multilayer wiring layer includes a pad electrode in a portion corresponding to the first area,*

*the pad electrode is electrically connected to a bump, the bump being provided, via a conductive layer, on a side of the logic circuit component opposite to an incident side of the light, the conductive layer including a first part and a second part, the first part extending in the in-plane direction, the first part being connected the bump, one end of the second part being connected to the first part at a connecting point, another end of the second part being connected to the pad electrode, the connecting point being located between the another end of the second part and the bump in a plane view of the solid-state imaging device, the second part being tilted with respect to a perpendicular line perpendicular to the layers of the solid-state imaging device such that the one end of the second part is located closer to the pixel area than the another end of the second part in the plane view, and*

*a side end face of the filter layer inclines to be reduced in width from a side of the transparent substrate toward a side of the solid-state imaging component.*

*29. The solid-state imaging device according to claim 28, wherein*

*an insulating layer is provided between the second semiconductor substrate and the conductive layer.*

*30. The solid-state imaging device according to claim 29, wherein*

*a via hole is formed to expose a part of the pad electrode in the first area, and*

*the insulating layer is provided between the second semiconductor substrate and the conductive layer at least in the via hole.*

*31. The solid-state imaging device according to claim 30, wherein*

*the via hole includes a taper surface.*

*32. The solid-state imaging device according to claim 29, wherein*

*the insulating layer includes an opening at a portion corresponding to the pad electrode, and*

*the conductive layer is electrically connected with the pad electrode via the opening.*

* * * * *